(12) United States Patent
Nishi et al.

(10) Patent No.: US 6,593,691 B2
(45) Date of Patent: Jul. 15, 2003

(54) EL DISPLAY DEVICE

(75) Inventors: Takeshi Nishi, Kanagawa (JP); Noriko Ishimaru, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 190 days.

(21) Appl. No.: 09/735,096

(22) Filed: Dec. 11, 2000

(65) Prior Publication Data

US 2001/0004190 A1 Jun. 21, 2001

(30) Foreign Application Priority Data

Dec. 15, 1999 (JP) .......................................... 11-356732

(51) Int. Cl.⁷ .............................................. H01J 63/04
(52) U.S. Cl. ..................... 313/506; 313/310; 315/169.3
(58) Field of Search ................... 313/506, 505, 313/311, 483, 306, 307, 310, 346 R; 315/169.6, 167

(56) References Cited

U.S. PATENT DOCUMENTS

| | | | |
|---|---|---|---|
| 4,984,034 A | 1/1991 | Yamazaki | |
| 5,643,826 A | 7/1997 | Ohtani et al. | 437/88 |
| 5,711,824 A | 1/1998 | Shinohara et al. | 136/259 |
| 5,891,264 A | 4/1999 | Shinohara et al. | 136/261 |
| 6,056,614 A | 5/2000 | Adachi | 445/24 |
| 6,072,450 A * | 6/2000 | Yamada et al. | 313/500 |
| 6,114,715 A * | 9/2000 | Hamada | 257/59 |

FOREIGN PATENT DOCUMENTS

| | | |
|---|---|---|
| JP | 7-130652 | 5/1995 |
| JP | 7-220871 | 8/1995 |
| JP | 8-096959 | 4/1996 |
| JP | 8-330602 | 12/1996 |
| JP | 9-063770 | 3/1997 |
| JP | 9-069642 | 3/1997 |
| JP | 10-144927 | 5/1998 |
| JP | 10-189252 | 7/1998 |
| JP | 10-270363 | 10/1998 |
| JP | 11-076967 | 3/1999 |

OTHER PUBLICATIONS

1) English Abstract re Japanese patent application No. JP 9–069642, published Mar. 11, 1997.
2) English Abstract re Japanese patent application No. JP 10–144927, published May 29, 1998.
3) English Abstract re Japanese patent application No. JP 10–189252, published July 21, 1998.
Higashigaki, Y. et al. "Holographic Directive Reflectors for Reflective Color LCDs" Sharp Technical Report vol. 74, pp. 16–19, Aug., 1999.

* cited by examiner

Primary Examiner—Don Wong
Assistant Examiner—Thuy Vinh Tran
(74) Attorney, Agent, or Firm—Cook, Alex, McFarron, Manzo, Cummings & Mehler, Ltd.

(57) ABSTRACT

An EL display device capable of reducing an average film resistance of an anode in an EL device as well as displaying an image with high definition, and electrical equipment including such an EL display device are provided. A light-shielding metal film (109) is provided on an anode (108) so as to conceal gaps between the pixels. Thus, an average film resistance of the anode (108) in the EL device is reduced. Furthermore, light leakage from the gaps between the pixels can be prevented, resulting in an image display with high definition.

54 Claims, 13 Drawing Sheets

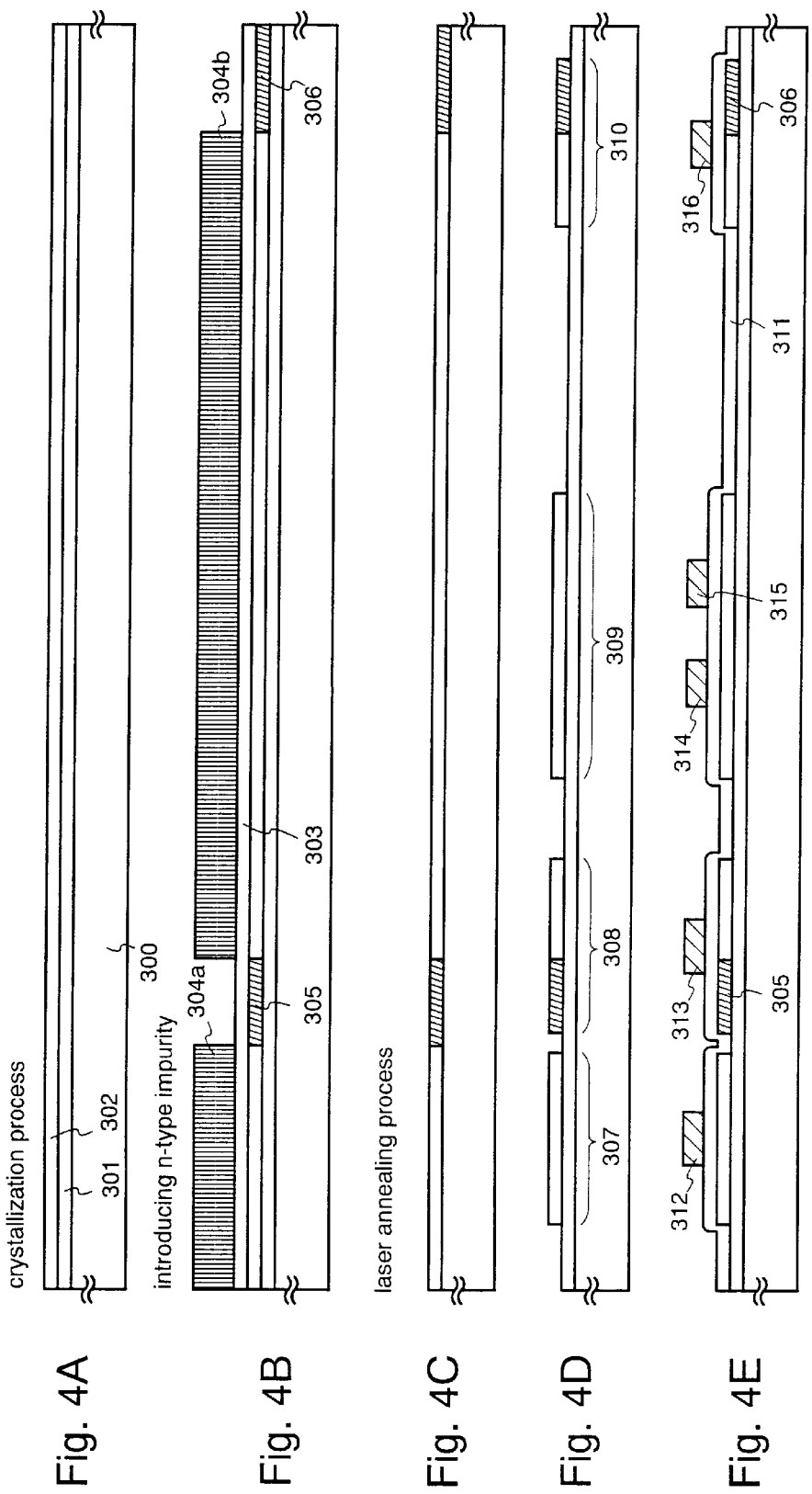

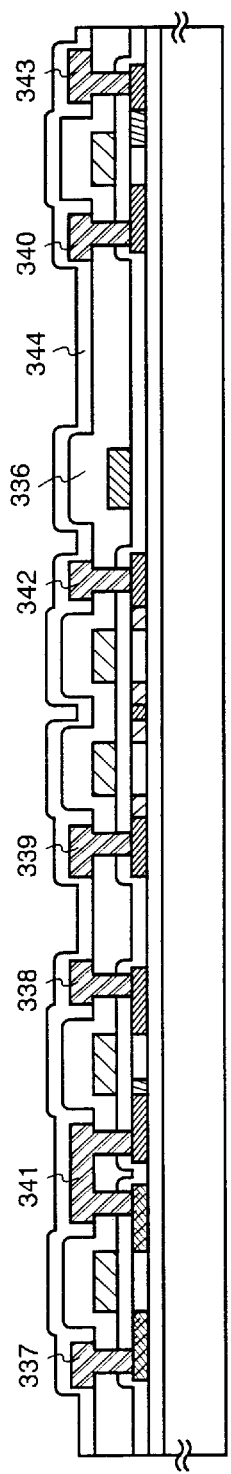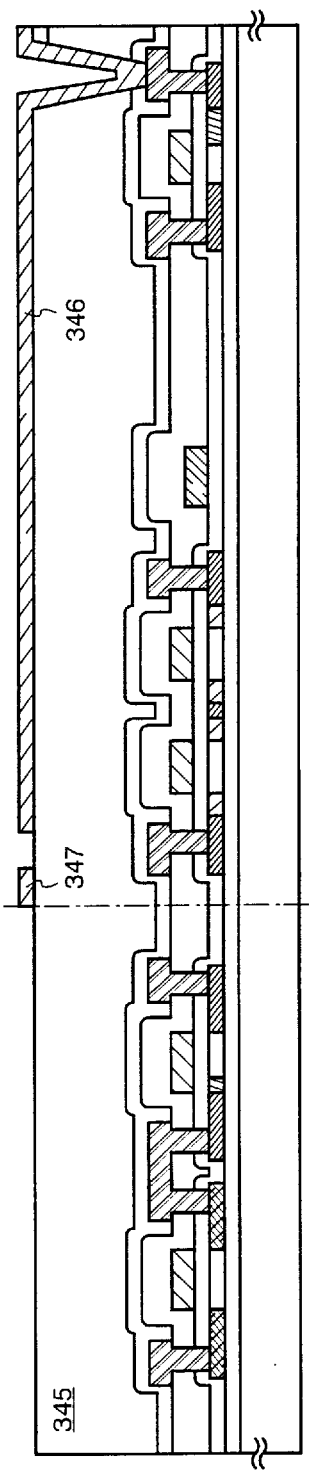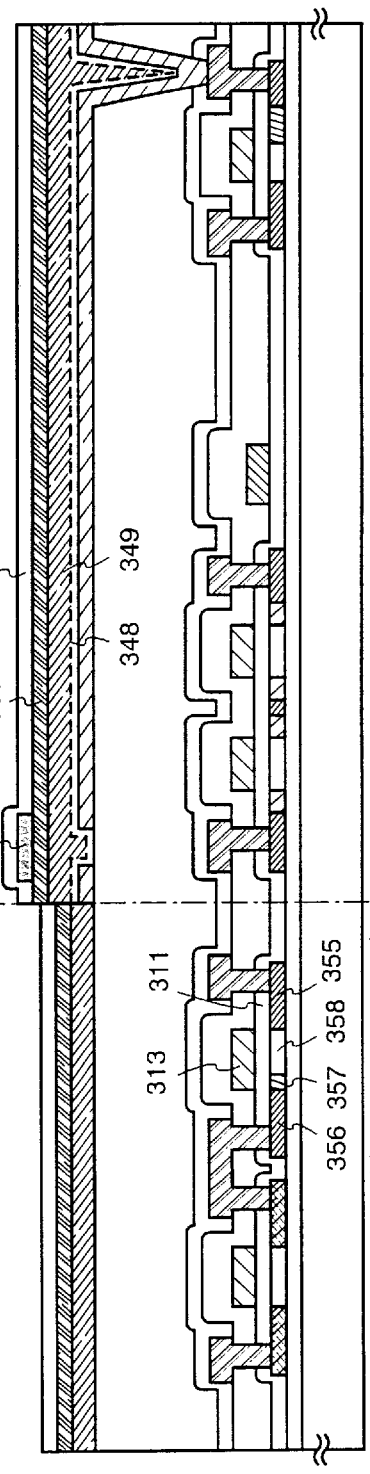
Fig. 6A
Fig. 6B
Fig. 6C

Fig. 9
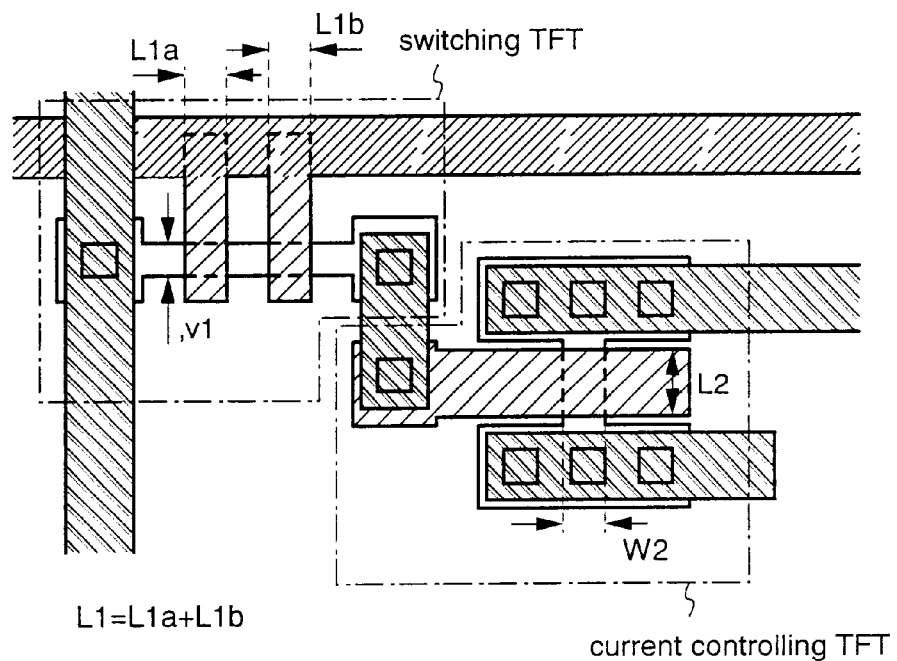
L1=L1a+L1b
current controlling TFT
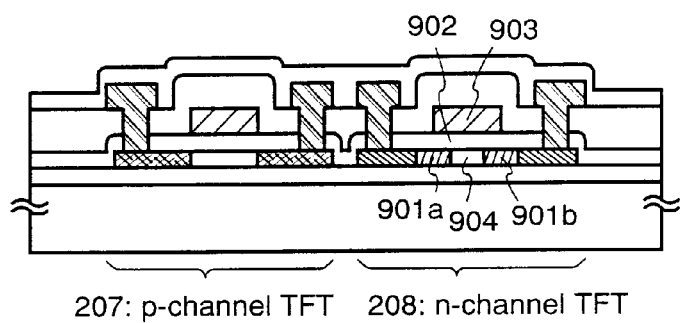
Fig. 10
207: p-channel TFT    208: n-channel TFT

EL DISPLAY DEVICE

BACKGROUND OF THE INVENTION

1. Field of the Invention

The present invention relates to an EL (electroluminescence) display device fabricated by forming a semiconductor device (a device utilizing a semiconductor thin film; typically a thin film transistor) onto a substrate. The present invention further relates to an electrical equipment including such an EL display device as a display section.

2. Description of the Related Art

Recently, a technique for forming a thin film transistor (hereinafter referred to as TFT) onto a substrate has significantly advanced, and its application to an active-matrix display device has been developed. In particular, the TFT employing a polysilicon film therein has a field effect mobility higher than that of the conventional TFT employing an amorphous silicon film, and therefore, can operate at higher speed. Thus, a control function for pixels, that is conventionally performed by an external driver circuit provided at the outside of the substrate, can be performed by a driver circuit that is provided on the same substrate as the pixels.

The active-matrix display device as mentioned above can provide various advantages such as reduction in the manufacturing cost, downsizing of the display device, improvement of the yield, reduction in the throughput or the like, when various circuits and/or devices are fabricated on one and the same substrate. Thus, this kind of active-matrix display device has drawn much attention.

In an active-matrix EL display device, a switching device employing a TFT (hereinafter referred to as switching TFT) is provided at each pixel, and each of the respective switching TFTs allows a corresponding drive device for controlling current (hereinafter referred to as current-controlling TFT) to drive, thereby causing an EL layer (more strictly speaking, a light emitting layer) to emit light. An exemplary EL display device is described, for example, in Japanese Patent Application Laid-Open No. Hei. 10-189252.

The EL display device includes a device section composed of a cathode, an EL layer, and an anode (hereinafter, the device composed of these portions is referred to as EL device). When a film resistance of the anode in the device section increases, the in-plane distribution of electrical potentials in the anode becomes non-uniform due to the voltage drop, thereby resulting in disadvantages such as deviations in the light intensity of the EL device.

SUMMARY OF THE INVENTION

Accordingly, an object of the present invention is to provide an EL display device having the structure capable of lowering a film resistance of an anode in an EL device or exhibiting any corresponding advantages. Furthermore, another objective of the present invention is to provide electrical equipment having a display section which operates stably by employing such an EL display device as the display section.

The present invention will be described below with reference to FIG. 1. In FIG. 1, reference numeral 101 denotes a substrate having an insulating surface. As the substrate 101, for example, an insulating substrate such as a quartz substrate can be used. Alternatively, various kinds of substrate, such as a glass substrate, a ceramic substrate, a crystallized glass substrate, a metal substrate, or a plastic substrate, can be used by providing an insulating film on a surface thereof.

On the substrate 101, pixels 102 are formed. Although only three of the pixels are illustrated in FIG. 1, a higher number of pixels are actually arranged in matrix. Further, only one of the three pixels will be described below, but the other pixels have the same configuration as the explained one.

In each of the pixels 102, two TFTs are formed; one of them is a switching TFT 103, and the other is a current-controlling TFT 104. A drain of the switching TFT 103 is electrically connected to a gate of the current-controlling TFT 104. Furthermore, a drain of the current-controlling TFT 104 is electrically connected to a pixel electrode 105 (which, in this case, also functions as a cathode of an EL device). The pixel 102 is thus formed.

Various wirings of the TFT as well as the pixel electrode can be formed of a metal having a low resistivity. For example, an aluminum alloy may be used herein for this purpose.

Following the fabrication of the pixel electrode 105, an insulating compound (referred to as alkaline compound hereinafter) 106 containing an alkaline metal or an alkaline-earth metal is formed. It should be noted that the outline of the alkaline compound 106 is indicated by a dotted line in FIG. 1 because the compound 106 has a thickness which is as thin as several nanometers, and it is not clear whether the compound 106 is formed as a layer or in an island-shape.

As the above-mentioned alkaline compound 106, lithium fluoride (LiF), lithium oxide ($Li_2O$), barium fluoride ($BaF_2$), barium oxide (BaO), calcium fluoride ($CaF_2$), calcium oxide (CaO), strontium oxide (SrO), or cesium oxide ($Cs_2O$) can be used. Since these are insulating materials, electrical short-circuiting between the pixel electrodes does not occur even when the compound 106 is formed as a layer.

It is of course possible to use a known conductive material such as a MgAg electrode as the cathode. However, in such a case, in order to avoid electrical short-circuiting between the pixel electrodes, the cathode itself has to be selectively formed or patterned into a certain shape.

Once the alkaline compound 106 is formed, an EL layer 107 (an electro-luminescence layer) is formed over the compound 106. Any known material and/or structure can be employed for the EL layer 107. More specifically, with respect to the structure of the EL layer, only a light emitting layer for providing sites for the carrier recombination may be included in the EL layer. Alternatively, if necessary, an electron injection layer, an electron transport layer, a hole transport layer, an electron blocking layer, a hole device layer, or a hole injection layer may be further layered to form the EL layer. In the present application, all of those layers intended to realize injection, transport or recombination of carriers are collectively referred to as the EL layer.

As an organic material to be used as the EL layer 107, either a low-molecular type organic material or a polymer type (high-molecular type) organic material can be used. However, it is desirable to use a polymer type organic material which can be formed by a film-formation method that can be easily performed, such as a spin coating method, a printing method, or the like.

The structure illustrated in FIG. 1 is an example of the monochrome color light-emitting type in which an EL layer for emitting a monochrome color light, such as a red color, a blue color, a green color, a white color, a yellow color, an orange color, a purple color or the like, is used for displaying a monotone image. The EL layer for emitting any monochrome color light as mentioned above may be formed of known materials.

Over the EL layer 107, a transparent conductive film is formed as an anode 108. As the transparent conductive film, a compound of indium oxide and tin oxide (referred to as ITO), a compound of indium oxide and zinc oxide, tin oxide, or zinc oxide (ZnO) can be used.

In the present application, a film resistance of the whole anode obtained by calculating an average of a film resistance for a region where a metal film 109 and the anode 108 are layered and a film resistance for only the anode (in other words, a film resistance of the whole portion electrically connected to the anode) will be referred to as the average film resistance of the anode. By providing the metal film 109 over the anode, the average film resistance in the anode can be decreased. Furthermore, the metal film 109 also functions as a light shielding film.

As a deposition technique for the metal film 109, a vapor deposition method is desirable in view of any possible damage to the anode during the deposition process.

In addition, upon the provision of the metal film 109, it is preferable to provide the metal film 109 so that gaps 111 between the adjacent pixel electrodes are concealed thereby when viewed from the viewing direction of a viewer (i.e., from the direction of the normal to a counter electrode). This is because of the fact that those gaps are non-light emitting regions, as well as the fact that the electrical field distribution becomes complicated in the vicinity of end portions of the pixel electrodes so that light emission at a desired light intensity or a desired chromaticity cannot be realized there.

After the metal film 109 is formed as mentioned above, an insulating film as a second passivation film 112 is provided. As the passivation film 112, a silicon nitride film or a silicon oxynitride film (represented as SiOxNy) is preferably used. Although it is possible to use a silicon oxide film as the passivation film 112, it is preferable to use an insulating film containing oxygen as little as possible.

The substrate fabricated up to this stage is referred to as an active-matrix substrate in the present application. More specifically, the substrate on which TFTs, pixel electrodes respectively electrically connected to the TFTs, as well as EL devices each composed of an EL layer, an anode, and a metal film and utilizing the corresponding pixel electrode as a cathode are formed is referred to as the active-matrix substrate.

Furthermore, a counter substrate 110 is attached to the active-matrix substrate so that the EL devices are interposed and sealed therebetween. Although not illustrated herein, the counter substrate 110 is adhered to the active-matrix substrate by means of a sealing agent, so that a space designated with reference numeral 113 becomes a closed space.

As the counter substrate 110, it is necessary to use a transparent substrate so as not to prevent light from passing therethrough. For example, a glass substrate, a quartz substrate, or a plastic substrate is preferably used.

The closed space 113 may be filled with inert gas (noble gas or nitrogen gas), or with inert liquid. Alternatively, the closed space 113 may be filled with a transparent additive agent or resin so as to adhere the whole surface of the substrate. Moreover, it is preferable to dispose a drying agent such as barium oxide or the like in the closed space 113. Since the EL layer 107 is very vulnerable to water, it is desirable to prevent water from entering the closed space 113 as much as possible.

In the EL display device having the above-described configuration in accordance with the present invention, light emitted from the EL device passes through the counter substrate to be emitted to reach the viewer's eyes. Accordingly, the viewer can recognize an image through the counter substrate side. In this situation, one of the features of the EL display device in accordance with the present invention is that the metal film 109 having a low electrical resistivity is disposed on the anode 108 included in the EL device so that the gaps 111 between the adjacent pixel electrodes 105 are concealed by the metal film 109. This results in a decreased average film resistance of the anode in the EL device as well as prevention of light leakage from the gaps 111 between the pixel electrodes 105. Thus, an image can be displayed with clear contours between the pixels.

Thus, in accordance with implementing the present invention, an EL display device capable of having a reduced average film resistance of an anode in the EL device section as well as displaying an image with clear contours between the pixel electrodes can be provided. Furthermore, electrical equipment employing such an EL display device as a display section can be also provided.

BRIEF DESCRIPTION OF THE DRAWINGS

FIGS. 4A through 4E are views for respectively illustrating the fabricating steps of an active-matrix EL display device.

FIGS. 6A through 6C are views for respectively illustrating the fabricating steps of the active-matrix EL display device.

FIG. 9 is an expanded view of the pixel in the EL display device.

FIG. 10 is a view for illustrating the structure of a sampling circuit of the EL display device.

DETAILED DESCRIPTION OF THE PREFERRED EMBODIMENTS

Figure 2:
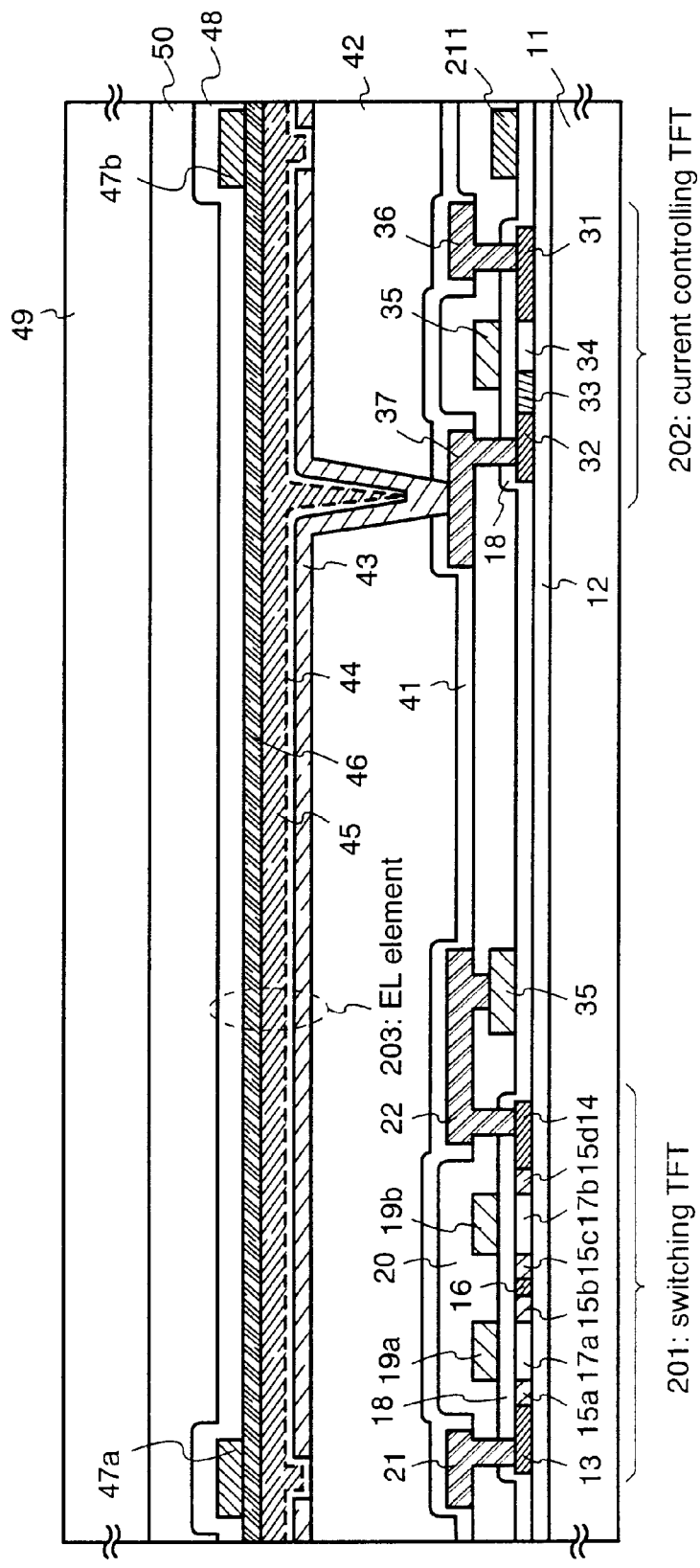
FIG. 2 is a view for illustrating a cross-sectional structure of a pixel of the EL display device.
Figure 3A:
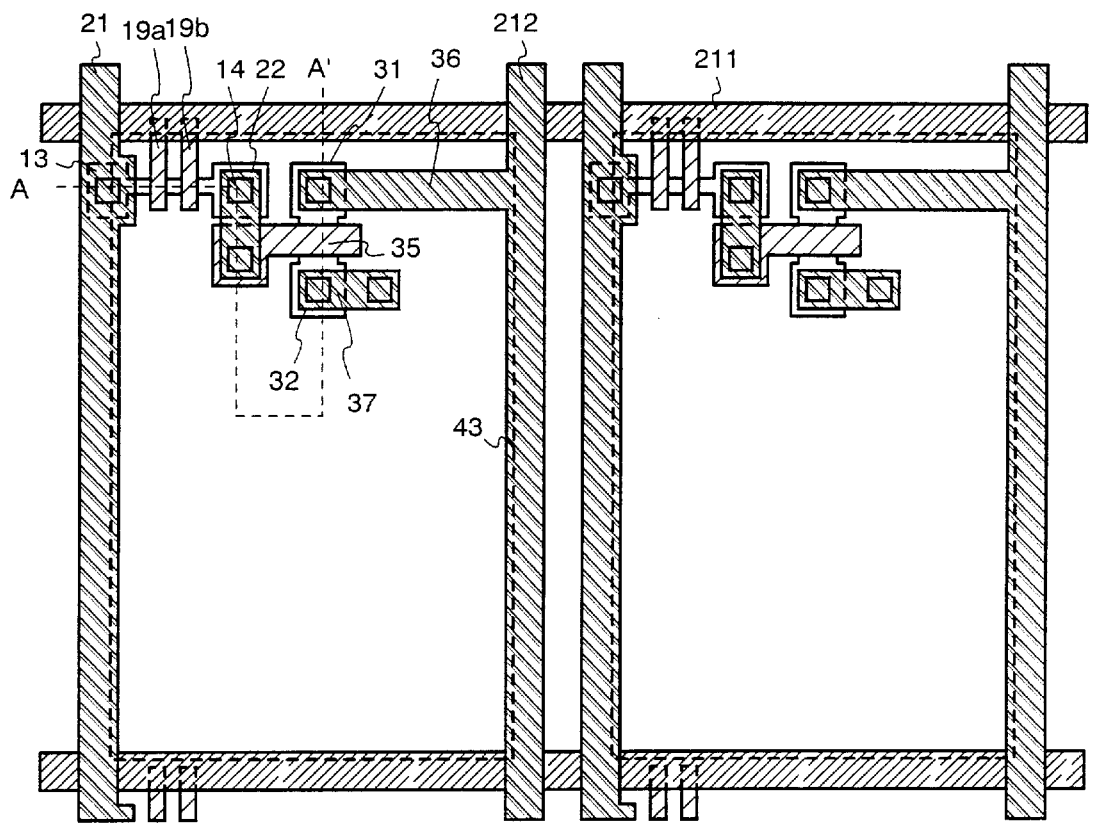
FIGS. 3A and 3B are a view for illustrating a top structure of the pixel section of the EL display device and a view for illustrating the configuration of the pixel section of the EL display device, respectively.
Figure 3B:
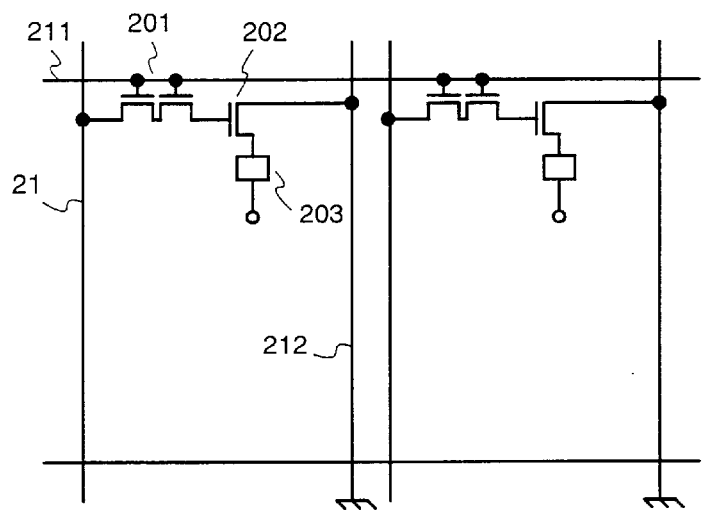

One of various embodiments of the present invention will be described with reference to FIGS. 2, 3A, and 3B. FIG. 2 shows a cross-sectional view of a pixel section of the EL display device in accordance with the present invention. FIG. 3A shows a top view of the pixel section and FIG. 3B shows the circuit configuration therefor. The pixel section (image display section) is actually configured by arranging a plurality of pixels in matrix. FIG. 2 corresponds to a cross-sectional view obtainable by cutting FIG. 3A along line A–A'. Accordingly, the same reference numerals are commonly used among FIGS. 2, 3A, and 3B for convenience when viewing those drawings. Furthermore, two pixels illustrated in the top view of FIG. 3A have the identical structure with each other.

In FIG. 2, a reference numeral 11 designates a substrate; and 12, an insulating film (hereinafter referred to as base film) which becomes an undercoat. A glass substrate, a glass ceramic substrate, a quartz substrate, a silicon substrate, a ceramic substrate, a metal substrate, or a plastic substrate (including a plastic film as well) can be used as the substrate 11.

A base film 12 is particularly effective in the case where a substrate containing movable ions or a conductive substrate is used as the substrate 11. It is not necessary to provide the base film 12 when a quartz substrate is used as the substrate 11. As the base film 12, an insulating film containing silicon can be used. In the present application, the term "insulating film containing silicon" refers to an insulating film containing silicon, oxygen or nitrogen at a predetermined ratio, specifically, a silicon oxide film, a silicon nitride film, or a silicon oxynitride film (represented as SiOxNy.)

Here, two TFTs are formed in the pixel. A reference numeral 201 designates a TFT (hereinafter referred to as switching TFT) functioning as a switching element; and 202, a TFT (hereinafter referred to as current controlling TFT) functioning as a current controlling element for controlling the amount of current flowing to the EL element. Both are formed out of an n-channel TFT.

An n-channel type TFT has a field effect mobility larger than that of a p-channel type TFT, and therefore, can be operated at higher speed and allow a larger amount of current to flow, as compared to the p-channel type TFT. The smaller-sized n-channel type TFT can allow the same amount of current to flow therethrough as the p-channel type TFT. Accordingly, it is preferable to employ the n-channel type TFT as the current-controlling TFT because larger effective area of the display section can be obtained.

In the p-channel type TFT, hot carrier injection is almost negligible. In addition, an OFF current value of the p-channel type TFT is low. Due to these advantages, the p-channel type TFT has been used in some reports as the switching TFT or the current-controlling TFT. However, in accordance with the present invention, disadvantages concerning the hot carrier injection and the OFF current value are overcome even for the n-channel type TFT by providing LDD regions at shifted positions. This leads to another feature of the present invention in that all of the TFTs to be used in every pixel are n-channel type TFTs.

It should be noted, however, that in the present invention, the switching TFT and the current-controlling TFT are not limited to be the n-channel type TFT. Alternatively, a p-channel type TFT can be used either as the switching TFT or as the current-controlling TFT, or as both of them.

The switching TFT 201 is formed having: an active layer containing a source region 13, a drain region 14, LDD regions 15a to 15d, a high concentration impurity region 16, and channel forming regions 17a and 17b; a gate insulating film 18; gate electrodes 19a and 19b; a first interlayer insulating film 20; a source wiring 21; and a drain wiring 22.

In addition, as illustrated in FIGS. 3A and 3B, gate electrodes 19a and 19b are electrically connected with each other by means of a gate wiring 211 made of a different material having a lower electrical resistance, thereby resulting in the double-gate structure. It should be noted that not only the double-gate structure, but also any other multi-gate structure such as the triple-gate structure, (i.e., a structure including an active layer that has two or more channel-forming regions connected in series to each other) can be used. The multi-gate structure is very effective for realizing reduction in an OFF current value. In the present invention, a switching device with a low OFF current value can be realized by providing the switching device 201 in the pixel with the multi-gate structure.

The active layer is formed out of a semiconductor film containing a crystal structure. That is, a single crystal semiconductor film may be used or a polycrystalline semiconductor film or microcrystalline semiconductor film may be used. The gate insulating film 18 may be formed out of an insulating film containing silicon. Besides, any conductive films can be used for the gate electrodes, source wiring line, or drain wiring line.

Furthermore, in the switching TFT 201, LDD regions 15a to 15d are provided at such positions so as not to overlap the gate electrodes 19a and 19b with a gate insulating film 18 interposed therebetween. This kind of structure is highly effective for reducing an OFF current value.

In the case where the multi-gate structure with two or more gate electrodes being employed is provided, a high-concentration impurity region disposed between the channel-forming regions is effective for reducing an OFF current value.

As described above, by using the TFT of the multi-gate structure as the switching element 201 of the pixel, it is possible to realize the switching element having a sufficiently low off current value. Thus, even if a condenser as shown in FIG. 2 of Japanese Patent Application Laid-open No. Hei 10-189252 is not provided, the gate voltage of the current controlling TFT can be held for a sufficient time (an interval between a selected point and a next selected point).

Next, the current controlling TFT 202 is formed by including a source region 31, a drain region 32, an active layer including an LDD region 33 and a channel forming region 34, a gate insulating film 18, a gate electrode 35, the first interlayer insulating film 20, a source wiring line 36, and a drain wiring line 37. Although the gate electrode 35 is of a single gate structure, a multi-gate structure may be adopted.

As shown in FIG. 2, the drain of the switching TFT 201 is connected to the gate of the current controlling TFT 202. Specifically, the gate electrode 35 of the current controlling TFT 202 is electrically connected to the drain region 14 of the switching TFT 201 through the drain wiring line (may be called a connection wiring line) 22. The source wiring line 36 is connected to a current supply line 212 (FIG. 3A).

Although the current controlling TFT 202 is an element for controlling the amount of current injected to an EL element 203, in view of deterioration of the EL element, it is not desirable to supply a large amount of current. Thus, in order to prevent excessive current from flowing to the current controlling TFT 202, it is preferable to design the channel length (L) to be rather long. Desirably, it is designed so that the current becomes 0.5 to 2 $\mu$m (preferably 1 to 1.5 $\mu$m) per pixel.

In view of the above, as shown in FIG. 9, when the channel length of the switching TFT is L1 (L1=L1a+L1b), the channel width is W1, the channel length of the current controlling TFT is L2, and the channel width is W2, it is preferable that W1 is made 0.1 to 5 μm (typically 0.5 to 2 μm), and W2 is made 0.5 to 10 μm (typically 2 to 5 μm). Be it is preferable that L1 is made 0.2 to 18 μm (typically 2 to 15 μm), and L2 is made 1 to 50 μm (typically 10 to 30 μm). However, the present invention is not limited to the above numerical values.

Besides, it is appropriate that the length (width) of the LDD region formed in the switching TFT 201 is made 0.5 to 3.5 μm, typically 2.0 to 2.5 μm.

In the EL display device as illustrated in FIG. 2, an LDD region 33 is provided between a drain region 32 and a channel-forming region 34 in the current-controlling TFT 202. Although in the illustrated structure, the LDD region 33 includes a region overlapping a gate electrode with a gate insulating film 18 interposed therebetween as well as a region that does not overlap the gate electrode 35, it is possible to form another structure in which the LDD region 33 is configured only with a region overlapping the gate electrode 35 with the gate insulating film 18 interposed therebetween.

The current controlling TFT 202 supplies current to cause the EL element 203 to emit light, and at the same time controls the supply amount to enable gradation display. Thus, it is necessary to take a countermeasure against deterioration due to the hot carrier injection so that deterioration does not occur even if current is supplied.

With respect to deterioration due to the hot carrier injection, it is known that the LDD region overlapping the gate electrode is significantly effective. Accordingly, the structure in which the LDD region is provided in regions overlapping the gate electrode 35 with the gate insulating film 18 interposed therebetween is suitable for suppressing the hot carrier injection. However, in the illustrated structure of the present embodiment, another LDD region that does not overlap the gate electrode is also provided as the countermeasure for the disadvantages relating to the OFF current. It should be noted, however, that the LDD region not overlapping the gate electrode is not necessarily required to be provided.

In addition, when the overlapping length of the LDD region under the gate electrode is too long, an ON current gets reduced, while the hot carrier prevention effect becomes weakened when the overlapping length is too short.

Thus, in the present embodiment, the LDD region that overlaps the gate electrode is provided at the overlapping length determined in view of the above-mentioned facts, as illustrated in FIG. 2. Furthermore, the capacitance created by providing the LDD region overlapping the gate electrode is employed as a storage capacitance.

In the above structure, parasitic capacity is formed in the region where the gate electrode and the LDD region overlap with each other. Thus, it is preferable not to provide such region between the source region 31 and the channel forming region 34. In the current controlling TFT, since the direction of flow of carriers (here, electrons) is always the same, it is sufficient if the LDD region is provided at only the side of the drain region.

From the view point of increasing an amount of current that can flow, it is also effective to provide an active layer (in particular, a channel-forming region thereof) in the current-controlling TFT 202 to have a large film thickness (preferably in the range from 50 to 100 nm, and more preferably in the range from 60 to 80 nm). Conversely, with respect to the switching TFT 201, it is also effective to provide an active layer (in particular, a channel-forming region thereof) in the switching TFT 201 to have a small film thickness (preferably in the range from 20 to 50 nm, and more preferably in the range from 25 to 40 nm) in order to suppress an OFF current value.

Then, reference numeral 41 denotes a first passivation film. A film thickness of the first passivation film 41 may be set in the range from 10 nm to 1 μm (preferably, 200 to 500 nm). As the material of the passivation film 41, an insulating film containing silicon can be used (in particular, a silicon oxynitride film or a silicon nitride film is preferable).

Over the first passivation film 41, a second interlayer insulating film 42 (also referred to as planarizing film) is formed to cover the respective TFTs, so that steps introduced by the TFTs are planarized. As the second interlayer insulating film 42, an organic resin film is preferably used. For example, a polyimide film, a polyamide film, an acrylic film, a BCB (benzocyclobutene) film or the like may be used. It is of course possible to use an inorganic film so long as sufficient planarization can be realized.

The planarization of the steps, caused by TFTs, with the second interlayer insulating film 42 is very important. Since the EL layer to be formed later is very thin, any underlying steps may lead to insufficient light emission. Accordingly, it is preferable to perform the planarization process prior to the formation of pixel electrodes so as to form the EL layer on a surface as flat as possible.

Reference numeral 43 denotes a pixel electrode (corresponding to a cathode of the EL device) made of a conductive film having light shielding properties. After forming a contact hole (an opening hole) through the second interlayer insulating film 42 and a first passivation film 41, the pixel electrode 43 is formed to be connected to a drain wiring 37 of the current-controlling TFT 202 at the formed opening hole section.

On the pixel electrode 43, a lithium fluoride film having a thickness in the range from 5 to 10 nm is formed as an alkaline compound 44 by a vapor deposition method. The lithium fluoride film is an insulating film, and therefore, a current cannot flow toward the EL layer when a film thickness of the lithium fluoride film is too thick. No adverse problem will be introduced even when the lithium fluoride film is formed, not in a layer, but in an island-shape.

The EL layer 45 is then formed. In the present embodiment, a polymer-type organic material is formed by a spin coating method. As the polymer-type organic material, any known material can be used. In addition, in the present embodiment, a single layer which is a light emitting layer is used as the EL layer 45. Alternatively, when the EL layer has a layered structure in which the light emitting layer is combined with a hole transport layer and/or an electron transport layer, a higher light emission efficiency can be obtained. It should be noted that when a polymer-type organic material is layered, it is preferable to combine it with a low-molecular organic compound formed by a vapor deposition method. The reason therefor is as follows. In a spin coating method, an organic material to form the EL layer is mixed into an organic solvent and then applied onto an underlying surface. Accordingly, any organic material, if existing in the underlying layer, may dissolve again in the applied organic solvent.

Typical polymer-type organic materials that can be used in the present embodiment include various high-molecular materials such as a polyparaphenylenevinylene (PPV) type material, a polyvinylcarbazole (PVK) type material, a polyfluorene type material, or the like. When an electron transport layer, a light emitting layer, a hole transport layer, or a hole injection layer is to be formed of the above-mentioned polymer-type organic materials, these materials may be applied in the condition of a polymer precursor and then heated (baked) in vacuum to be transferred into an intended polymer type organic materials.

More specifically, for forming a light emitting layer, cyanopolyphenylenevinylene may be used for a red-color light emitting layer, polyphenylenevinylene may be used for a green-color light emitting layer, and polyphenylenevinylene or polyalkylphenylene may be used for a blue-color light emitting layer. A film thickness of the above layers may be set in the range from 30 to 150 nm (preferably in the range from 40 to 100 nm). In addition, for forming a hole transport layer, polytetrahydrothiophenylphenylene which is a polymer precursor is used, which is then transferred into polyphenylenevinylene by a heating treatment. A film thickness of the above layer may be set in the range from 30 to 100 nm (preferably in the range from 40 to 80 nm.)

It is also possible to realize white-color light emission with a polymer-type organic material. For that purpose, techniques described in Japanese Patent Application Laid-Open Nos. Hei. 8-96959,7-220871,9-63770, or the like may be employed. Since the polymer-type organic material can easily realize color adjustment by adding a fluorescent pigment into a solution in which a host material is being dissolved, the material is particularly effective for obtaining the white-color light emission.

It should be noted that the above-mentioned materials are merely examples that can be used as an EL layer in the present invention. It is not intended to limit the present invention to those materials.

In addition, although it is described in the above to use a polymer-type organic material for forming an EL device, a low-molecular type organic material can be used for that purpose. Furthermore, the EL layer can be made of an inorganic material.

Upon the formation of the EL layer 45, it is desirable to perform the formation process in a dry inert gas atmosphere which contains water of as less amount as possible. Since the EL layer easily deteriorates due to existence of water or oxygen, these factors should be eliminated as perfectly as possible upon the formation of the EL layer. For example, a dry nitrogen atmosphere, a dry argon atmosphere or the like is preferable. Accordingly, it is desirable to accommodate a chamber to be used for an application process or a chamber to be used for a baking process in a clean booth filled with inert gas, and perform the process in such an atmosphere.

Following the formation of the EL layer 45 as described above, an anode 46 made of a transparent conductive film is then formed. In the present embodiment, a conductive film made of a compound of indium oxide and tin oxide is used as the anode 46. A small amount of gallium may be added thereto.

Then, a light-shielding metal film 47 (47a, 47b) is formed on the anode 46. In the present embodiment, the metal film 47 is disposed so as to conceal the gap between the pixel electrode 43 and the adjacent pixel electrode, and is intended to function as a light shielding film. In the present embodiment, a film resistance of the metal film 47 is set to be lower than the film resistance (also referred to as the sheet resistance) of the anode 46.

Close adhesion of the metal film 47 to the anode material is also important. Although it is important to use a proper metal material in order to obtain enhanced close adhesion, it is also effective to optimize conditions for the film deposition of the anode (a conductive film made of a compound of indium oxide and tin oxide in the present embodiment) and conditions for a heat treatment to be performed after the film deposition.

As the metal film 47, it is desirable to use a metal material having a low resistivity (also referred to as specific resistance). For example, titanium (Ti), aluminum (Al), tantalum (Ta), tungsten (W), chromium (Cr), copper (Cu), silver (Ag) or the like can be used as the metal material having a low resistivity.

Moreover, in the present embodiment, the metal film 47, which is to be formed directly on the anode 46, is desirably formed by a vapor deposition method. A film thickness thereof may be set in the range from 30 to 100 nm (preferably in the range from 40 to 80 nm.)

Following the formation of the metal film 47 as described above, a second passivation film 48 is formed. In the present embodiment, a silicon nitride film having a thickness in the range from 10 nm to 1 $\mu$m (preferably in the range from 200 to 500 nm) is used as the second passivation film 48.

A counter substrate 49 is provided so as to face the thus completed active-matrix substrate. In the present embodiment, a glass substrate is used as the counter substrate 49.

The active-matrix substrate and the counter substrate 49 are adhered to each other by means of a sealing agent (not illustrated) to form a closed space 50. In the present embodiment, the closed space 50 is filled with argon gas. It is also possible to dispose a drying agent as mentioned previously in the closed space 50.

The EL display device in the present embodiment has a pixel section composed of the pixel that has the structure as illustrated in FIG. 2. Furthermore, the two types of TFTs having different structures based on their functions are disposed in the pixel. More specifically, the switching TFT, that has a sufficiently low OFF current value, and the current-controlling TFT, that is capable of withstanding against the injection of hot carriers, are formed in the same pixel, thereby resulting in an EL display device that has a high reliability and is capable of reducing a resistance of an EL device therein.

Embodiment 1

The embodiments of the present invention are explained using FIGS. 4A to 6C. A method of simultaneous manufacturing of a pixel portion, and TFTs of a driver circuit portion formed in the periphery of the pixel portion, is explained here. Note that in order to simplify the explanation, a CMOS circuit is shown as a basic circuit for the driver circuits.

First, as shown in FIG. 4A, a base film 301 is formed with a 300 nm thickness on a glass substrate 300. Silicon oxynitride films are laminated as the base film 301 in embodiment 1. It is good to set the nitrogen concentration at between 10 and 25 wt % in the film contacting the glass substrate 300.

Besides, as a part of the base film 301, it is effective to provide an insulating film made of a material similar to the first passivation film 41 shown in FIG. 2. The current controlling TFT is apt to generate heat since a large current is made to flow, and it is effective to provide an insulating film having a heat radiating effect at a place as close as possible.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semiconductor film). In addition, a compound semiconductor film containing an amorphous structure, such as an amorphous silicon-germanium film, may also be used. Further, the film thickness may be made from 20 to 100 nm.

The amorphous silicon film is then crystallized by a known method, forming a crystalline silicon film (also referred to as a polycrystalline silicon film or a polysilicon film) 302. Thermal crystallization using an electric furnace, laser annealing crystallization using a laser, and lamp annealing crystallization using an infrared lamp exist as known crystallization methods. Crystallization is performed in this embodiment using an excimer laser light which uses XeCl gas.

Note that pulse emission type excimer laser light formed into a linear shape is used in this embodiment, but a rectangular shape may also be used, and continuous emission argon laser light and continuous emission excimer laser light can also be used.

In this embodiment, although the crystalline silicon film is used as the active layer of the TFT, it is also possible to use an amorphous silicon film. Further, it is possible to form the active layer of the switching TFT, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Next, as shown in FIG. 4B, a protective film 303 is formed on the crystalline silicon film 302 with a silicon oxide film having a thickness of 130 nm. This thickness may be chosen within the range of 100 to 200 nm (preferably between 130 and 170 nm). Furthermore, other films may also be used providing that they are insulating films containing silicon. The protective film 303 is formed so that the crystalline silicon film is not directly exposed to plasma during addition of an impurity, and so that it is possible to have delicate concentration control of the impurity.

Resist masks 304a and 304b are then formed on the protective film 303, and an impurity element which imparts n-type conductivity (hereafter referred to as an n-type impurity element) is added via the protective film 303. Note that elements residing in periodic table group 15 are generally used as the n-type impurity element, and typically phosphorous or arsenic can be used. Note that a plasma doping method is used, in which phosphine ($PH_3$) is plasma activated without separation of mass, and phosphorous is added at a concentration of $1 \times 10^{18}$ atoms/cm$^3$ in this embodiment. An ion implantation method, in which separation of mass is performed, may also be used, of course.

The dose amount is regulated so that the n-type impurity element is contained in n-type impurity regions 305 and 306, thus formed by this process, at a concentration of $2 \times 10^{16}$ to $5 \times 10^{19}$ atoms/cm$^3$ (typically between $5 \times 10^{17}$ and $5 \times 10^{18}$ atoms/cm$^3$).

Next, as shown in FIG. 4C, the protective film 303, resist masks 304a and 304b are removed, and an activation of the added periodic table group 15 elements is performed. A known technique of activation may be used as the means of activation, but activation is done in this embodiment by irradiation of excimer laser light. Of course, a pulse emission type excimer laser and a continuous emission type excimer laser may both, be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protective film 303 in place.

The activation by heat treatment may also be performed along with activation of the impurity element by laser light. When activation is performed by heat treatment, considering the heat resistance of the substrate, it is good to perform heat treatment on the order of 450 to 550° C.

A boundary portion (connecting portion) with end portions of the n-type impurity regions 305 and 306, namely regions, in which the n-type impurity element is not added, on the periphery of the n-type impurity regions 305 and 306, is not added, is delineated by this process. This means that, at the point when the TFTs are later completed, extremely good connections can be formed between LDD regions and channel forming regions.

Unnecessary portions of the crystalline silicon film are removed next, as shown in FIG. 4D, and island shape semiconductor films (hereafter referred to as active layers) 307 to 310 are formed.

Then, as shown in FIG. 4E, a gate insulating film 311 is formed, covering the active layers 307 to 310. An insulating film containing silicon and with a thickness of 10 to 200 nm, preferably between 50 and 150 nm, may be used as the gate insulating film 311. A single layer structure or a lamination structure may be used. A 110 nm thick silicon oxynitride film is used in this embodiment.

Thereafter, a conductive film having a thickness of 200 to 400 nm is formed and patterned to form gate electrodes 312 to 316. Respective end portions of these gate electrodes 312 to 316 may be tapered. In the present embodiment, the gate electrodes and wirings (hereinafter referred to as the gate wirings) electrically connected to the gate electrodes for providing lead wires are formed of different materials from each other. More specifically, the gate wirings are made of a material having a lower resistivity than the gate electrodes. Thus, a material enabling fine processing is used for the gate electrodes, while the gate wirings are formed of a material that can provide a smaller wiring resistance but is not suitable for fine processing. It is of course possible to form the gate electrodes and the gate wirings with the same material.

Although the gate electrode can be made of a single-layered conductive film, it is preferable to form a lamination film with two, three or more layers for the gate electrode if necessary. Any known conductive materials can be used for the gate electrode. It should be noted, however, that it is preferable to use such a material that enables fine processing, and more specifically, a material that can be patterned with a line width of 2 $\mu$m or less.

Typically, it is possible to use a film made of an element selected from tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy, Mo—Ta alloy), or a silicide film of the above element (typically a tungsten silicide film or titanium silicide film). Of course, the films may be used as a single layer or a laminate layer.

In this embodiment, a laminate film of a tungsten nitride (WN) film having a thickness of 50 nm and a tungsten (W) film having a thickness of 350 nm is used. This may be formed by a sputtering method. When an inert gas of Xe, Ne or the like is added as a sputtering gas, film peeling due to stress can be prevented.

The gate electrodes 313 and 316 are formed at this time so as to overlap a portion of the n-type impurity regions 305 and 306, respectively, sandwiching the gate insulating film 311. This overlapping portion later becomes an LDD region overlapping the gate electrode.

Figure 5A:
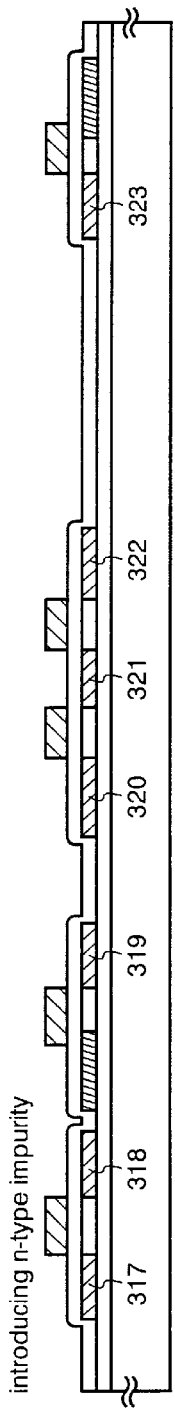
FIGS. 5A through 5D are views for respectively illustrating the fabricating steps of the active-matrix EL display device.

Next, an n-type impurity element (phosphorous in this embodiment) is added in a self-aligning manner with the gate electrodes 312 to 316 as masks, as shown in FIG. 5A. The addition is regulated so that phosphorous is added to impurity regions 317 to 323 thus formed at a concentration of $\frac{1}{10}$ to $\frac{1}{2}$ that of the impurity regions 305 and 306 (typically between $\frac{1}{4}$ and $\frac{1}{3}$). Specifically, a concentration of $1 \times 10^{16}$ to $5 \times 10^{18}$ atoms/cm$^3$ to $3 \times 10^{18}$ atoms/cm$^3$) is preferable.

Figure 5B:
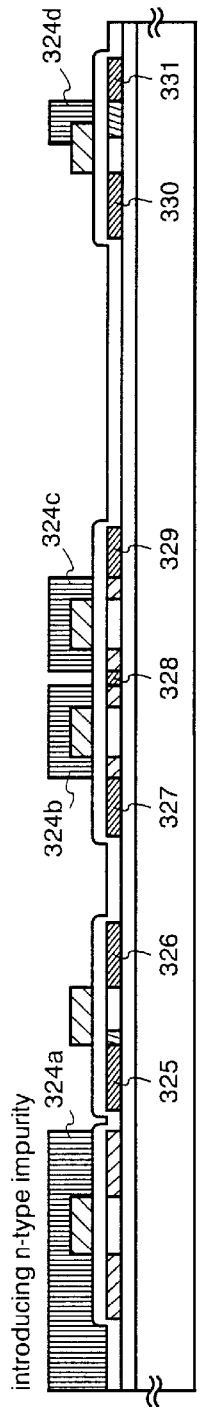

Resist masks 324a to 324d are formed next, with a shape covering the gate electrodes etc., as shown in FIG. 5B, and an n-type impurity element (phosphorous is used in this embodiment) is added, forming impurity regions 325 to 331 containing high concentration of phosphorous. Ion doping using phosphine ($PH_3$) is also performed here, and is regulated so that the phosphorous concentration of these regions is from $1 \times 10^{20}$ to $1 \times 10^{21}$ atoms/cm$^3$ (typically between $2 \times 10^{20}$ and $5 \times 10^{20}$ atoms/cm$^3$).

A source region or a drain region of the n-channel type TFT is formed by this process, and in the switching TFT, a portion of the n-type impurity regions 320 to 322 formed by the process of FIG. 5A are remained. These remaining regions correspond to the LDD regions 15a to 15d of the switching TFT in FIG. 2.

Figure 5C:
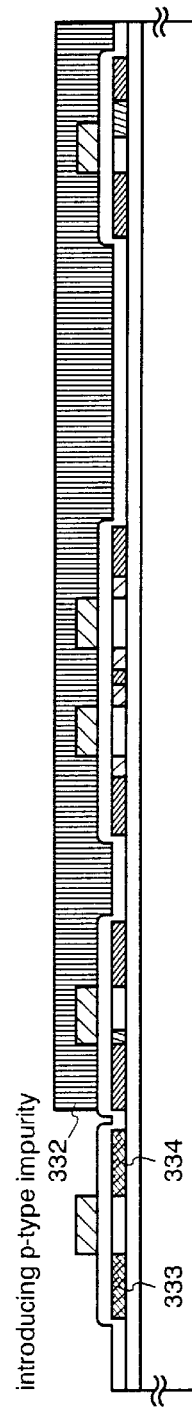

Next, as shown in FIG. 5C, the resist masks 324a to 324d are removed, and a new resist mask 332 is formed. A p-type impurity element (boron is used in this embodiment) is then added, forming impurity regions 333 and 334 containing boron at high concentration. Boron is added here to form impurity regions 333 and 334 at a concentration of $3 \times 10^{20}$ to $3 \times 10^{21}$ atoms/cm$^3$ (typically between $5 \times 10^{20}$ and $1 \times 10^{21}$ atoms/cm$^3$) by ion doping using diborane ($B_2H_6$).

Note that phosphorous has already been added to the impurity regions 333 and 334 at a concentration of $1 \times 10^{20}$ to $1 \times 10^{21}$ atoms/cm$^3$, but boron is added here at a concentration of at least three times more than that of the phosphorous. Therefore, the n-type impurity regions already formed completely invert to p-type, and function as p-type impurity regions.

Next, after removing the resist mask 332, the n-type and p-type impurity elements added to the active layer at respective concentrations are activated. Furnace annealing, laser annealing or lamp annealing can be used as a means of activation. In this embodiment, heat treatment is performed for 4 hours at 550° C. in a nitrogen atmosphere in an electric furnace.

At this time, it is critical to eliminate oxygen from the surrounding atmosphere as much as possible. This is because when even only a small amount of oxygen exists, an exposed surface of the gate electrode is oxidized, which results in an increased resistance and later makes it difficult to form an ohmic contact with the gate electrode. Accordingly, the oxygen concentration in the surrounding atmosphere for the activation process is set at 1 ppm or less, preferably at 0.1 ppm or less.

Figure 5D:
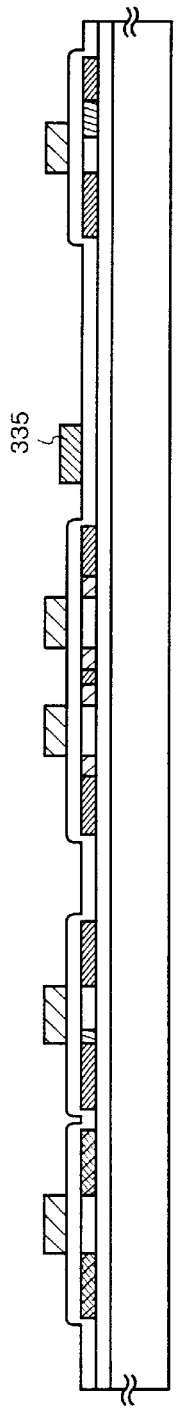

After the activation process is completed, the gate wiring 335 having a thickness of 300 nm is formed as shown in FIG. 5D. As a material for the gate wiring 335, a metal film containing aluminum (Al) or copper (Cu) as its main component (occupied 50 to 100% in the composition) can be used. The gate wiring 335 is arranged, as the gate wiring 211 shown in FIG. 3, so as to provide electrical connection for the gate electrodes 19a and 19b (corresponding to the gate electrodes 314 and 315 in FIG. 4E) of the switching TFT.

The above-described structure can allow the wiring resistance of the gate wiring to be significantly reduced, and therefore, an image display region (pixel portion) with a large area can be formed. More specifically, the pixel structure in accordance with the present embodiment is advantageous for realizing an EL display device having a display screen with a diagonal size of 10 inches or larger (or 30 inches or larger.)

A first interlayer insulating film 336 is formed next, as shown in FIG. 6A. A single layer insulating film containing silicon is used as the first interlayer insulating film 336, while a lamination film, which is a combination of insulating film including two or more kinds of silicon, may be used. Further, a film thickness of between 400 nm and 1.5 μm may be used. A lamination structure of an 800 nm thick silicon oxide film on a 200 nm thick silicon oxynitride film is used in this embodiment.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen which is thermally activated. Plasma hydrogenation (using hydrogen activated by a plasma) may also be performed as another means of hydrogenation.

Note that the hydrogenation processing may also be inserted during the formation of the first interlayer insulating film 336. Namely, hydrogen processing may be performed as above after forming the 200 nm thick silicon oxynitride film, and then the remaining 800 nm thick silicon oxide film may be formed.

Next, a contact hole is formed in the first interlayer insulating film 336 and the gate insulating film 311, and source wiring lines 337 to 340 and drain wiring lines 341 to 343 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by a sputtering method. Of course, other conductive films may be used.

A first passivation film 344 is formed next with a thickness of 50 to 500 nm (typically between 200 and 300 nm). A 300 nm thick silicon oxynitride film is used as the first passivation film 344 in this embodiment. This may also be substituted by a silicon nitride film. It is of course possible to use the same materials as those of the first passivation film 41 of FIG. 2.

Note that it is effective to perform plasma processing using a gas containing hydrogen such as $H_2$ or $NH_3$ etc. before the formation of the silicon oxynitride film. Hydrogen activated by this preprocess is supplied to the first interlayer insulating film 336, and the film quality of the first passivation film 344 is improved by performing heat treatment. At the same time, the hydrogen added to the first interlayer insulating film 336 diffuses to the lower side, and the active layers can be hydrogenated effectively.

Next, as shown in FIG. 6B, a second interlayer insulating film 345 made of organic resin is formed. As the organic resin, it is possible to use polyimide, polyamide, acryl, BCB (benzocyclobutene) or the like. Especially, since the second interlayer insulating film 345 is primarily used for flattening, acryl excellent in flattening properties is preferable. In this embodiment, an acrylic film is formed to a thickness sufficient to flatten a stepped portion formed by TFTs. It is appropriate that the thickness is made 1 to 5 μm (more preferably, 2 to 4 μm).

Thereafter, a contact hole is formed in the second interlayer insulating film 345 and the first passivation film 344 to reach the drain wiring 343, and then the pixel electrode 346 is formed. In the present embodiment, an aluminum alloy film (an aluminum film containing titanium of 1 wt %) having a thickness of 300 nm is formed as the pixel electrode 346. Reference numeral 347 denotes an end portion of the adjacent pixel electrode.

Then, the alkaline compound 348 is formed, as shown in FIG. 6C. In the present embodiment, a lithium fluoride film is formed by a vapor deposition method so as to have a film thickness of 5 nm. Thereafter, the EL layer 349 having a thickness of 100 nm is formed by spin coating.

In the present embodiment, as the polymer type organic material for providing light of white color, the materials disclosed in Japanese Laid-Open Patent Publication No. Hei 8-96959 or No. Hei 9-63770 can be used. For example, the material obtained by solving PVK (polyvinyl carbazole), Bu-PBD (2-(4'-tert-butylphenyl)-5-(4"-biphenyl)-1,3,4-oxydia zole), coumarin 6, DCM 1 (4-dicyanomethylene-2-methyl-6-p-dimethyl aminostilyl-4H-pyran), TPB (tetra phenyl butadiene), and Nile Red into 1,2-dichloromethane can be used.

In the present embodiment, the EL layer 349 has a single layer structure including only the above-mentioned light emitting layer. Alternatively, an electron injection layer, an electron transport layer, a hole transport layer, a hole injection layer, an electron blocking layer, or a hole element layer can be further formed, if necessary.

Then, the anode 350 made of a transparent conductive film having a thickness of 200 nm is formed to cover the EL layer 349. In this embodiment, a film made of a compound of indium oxide and zinc oxide is formed by a vapor deposition and then patterned to obtain the anode.

Next, the metal film 351 made from low resistivity metal is formed on the anode 350. Further, ir is preferable to use the metal material of the film thickness of metal film 351, which has lower film resistivity than that of the anode 350.

The etching is performed after a deposition of the metal film 351, because the metal film 351 is provided so as to conceal the gap between the pixel electrodes by seeing the direction of observation's eyes (a direction of a normal line of counter substrate). At this time, it is critical not to perform the etching simultaneously to the anode 350. In this embodiment, the dry etching method is used as a mean of etching and chloric gas is used for etching gas considering that the anode 350 is made of a compound of indium oxide and zinc oxide. In this embodiment, a laminated structure which is deposition of titanum and aluminum by vapor deposition is formed, and the metal film 351 is formed by titanium having a thickness of 50 nm on the anode 350 and aluminum having a thickness of 250 nm on the titanium.

The electrolytic corrosion (also referred to electrical chemical corrosion) can be prevented by a structure that titanium is put between the anode 350 and aluminum. Titanium nitride can be used as a substitution for titanium which is used here. Titanium nitride has an advantage of easy to contact electrically to the anode.

In this embodiment, the vapor deposition is used considering that a damage to the anode, but sputtering method can also be used.

The metal film 351 in the present invention is a laminated structure, but a single structure can be also applied to.

Finally, the second passivation film 351 made of a silicon nitride film is formed by a plasma CVD to have a thickness of 100 nm. This second passivation film 351 is intended to provide protection for the EL layer 349 against water or the like, and also function to release heat generated in the EL layer 349. In order to further enhance the heat radiation effect, it is advantageous to form the second passivation film by forming a silicon nitride film and a carbon film (preferably a diamond-like carbon film) into the lamination structure.

In this way, an active matrix EL display device having a structure as shown in FIG. 6C is completed. In the active matrix EL display device of this embodiment, a TFT having an optimum structure is disposed in not only the pixel portion but also the driver circuit portion, so that very high reliability is obtained and operation characteristics can also be improved.

First, a TFT having a structure to decrease hot carrier injection so as not to drop the operation speed thereof as much as possible is used as an n-channel type TFT 205 of a CMOS circuit which constitutes a driver circuit. Note that the driver circuit here includes a shift register, a buffer, a level shifter, a sampling circuit (sample and hold circuit) and the like. In the case where digital driver is made, a signal conversion circuit such as a D/A converter can also be included.

In the case of this embodiment, as shown in FIG. 6C, the active layer of the n-channel TFT 205 includes a source region 355, a drain region 356, an LDD region 357 and a channel forming region 358, and the LDD region 357 overlaps with the gate electrode 313 through the gate insulating film 311.

Consideration not to drop the operation speed is the reason why the LDD region is formed at only the drain region side. In this n-channel type TFT 205, it is not necessary to pay attention to an off current value very much, rather, it is better to give importance to an operation speed. Thus, it is desirable that the LDD region 357 is made to completely overlap with the gate electrode to decrease a resistance component to a minimum. That is, it is preferable to remove the so-called offset region.

Furthermore, deterioration of the p-channel type TFT 206 in the CMOS circuit due to the injection of hot carriers is almost negligible, and thus, it is not necessary to provide any LDD region for the p-channel type TFT 206. It is of course possible to provide the LDD region for the p-channel type TFT 206, similarly for the n-channel type TFT 205, to exhibit countermeasure against the hot carriers.

Note that, among the driver circuits, the sampling circuit is somewhat unique compared to the other circuits, in that a large electric current flows in both directions in the channel forming region. Namely, the roles of the source region and the drain region are interchanged. In addition, it is necessary to control the value of the off current to be as small as possible, and with that in mind, it is preferable to use a TFT having functions which are on an intermediate level between the switching TFT and the current controlling TFT in the sampling circuit.

Accordingly, in the n-channel type TFT for forming the sampling circuit, it is desirable to arrange the TFTs having the structure as shown in FIG. 10. As illustrated in FIG. 10, portions of the LDD regions 901a and 901b overlap the gate electrode 903 through the gate insulating film 902. The advantages obtainable by this structure have been already described with respect to the current controlling TFT 202. In the case where the TFT is used for the sampling circuit, the LDD regions are disposed to interpose the channel forming region 904 therebetween.

Figure 1:
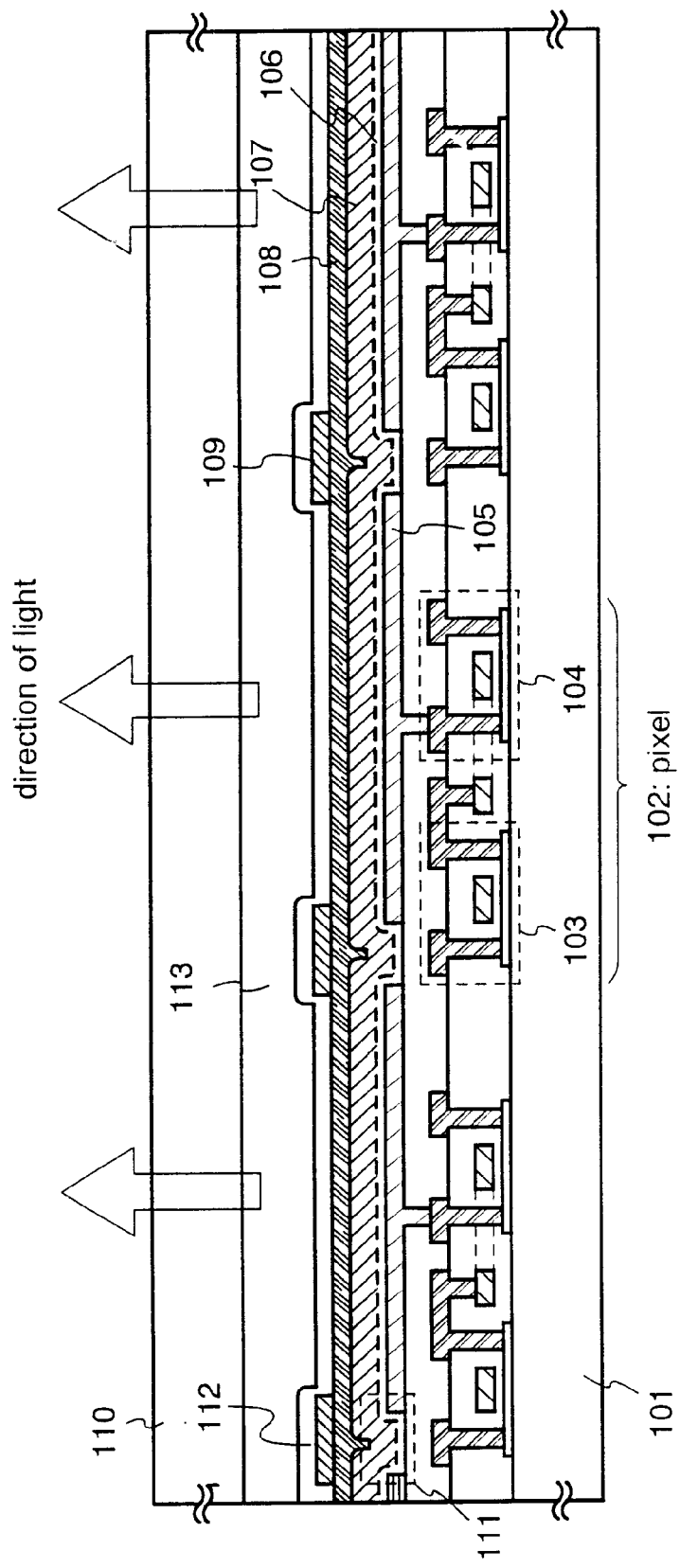
FIG. 1 is a view for illustrating a pixel section of an EL display device.

In the actual process, after the structure shown in FIG. 6C is completed, the EL layer is sealed in the closed space by using the counter substrate provided with the light shielding film, as previously described with reference to FIGS. 1 and 2. At this time, the reliability (lifetime) of the EL layer can be improved by setting an inert atmosphere within the closed space or disposing a moisture absorbing material (e.g., barium oxide) in the closed space.

After the sealing process of the active matrix substrate and the counter substrate is completed, a connector (flexible print circuit: FPC) is attached for connecting the terminals extended from the elements or circuits formed on the substrate to external signal terminals, thereby completing a final product.

Here, the structure of the active matrix EL display device of this embodiment will be described with reference to a perspective view of FIG. 7. The active matrix EL display device of this embodiment is constituted by a pixel portion 602, a gate side driver circuit 603, and a source side driver circuit 604 formed on a glass substrate 601. A switching TFT 605 of a pixel portion is an n-channel type TFT, and is disposed at an intersection point of a gate wiring line 606 connected to the gate side driver circuit 603 and a source wiring line 607 connected to the source side driver circuit 604. The drain of the switching TFT 605 is connected to the gate of a current controlling TFT 608.

Furthermore, the source side of the current controlling TFT 608 is connected to the power supply line 609. In the structure in accordance with the present embodiment, an arbitrary voltage is applied to the power supply line 609. The drain of the current controlling TFT 608 is connected to the EL element 610.

The connection wiring lines 612 and 613 for transmitting signals to the driver circuits and a connection wiring line 614 connected to the current supply line 609 are provided in an FPC 611 as an external input/output terminal.

Figure 7:
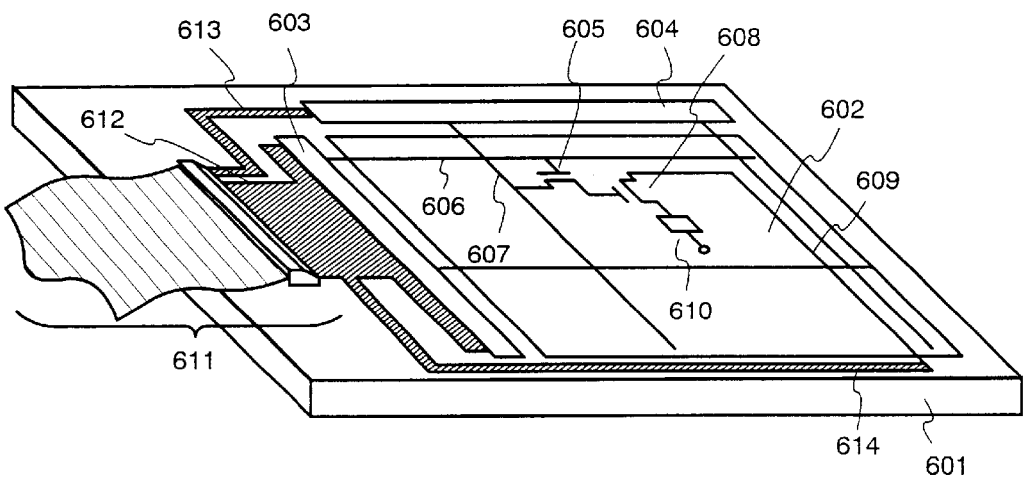
FIG. 7 is a perspective view for illustrating an external appearance of an EL module.
Figure 8:
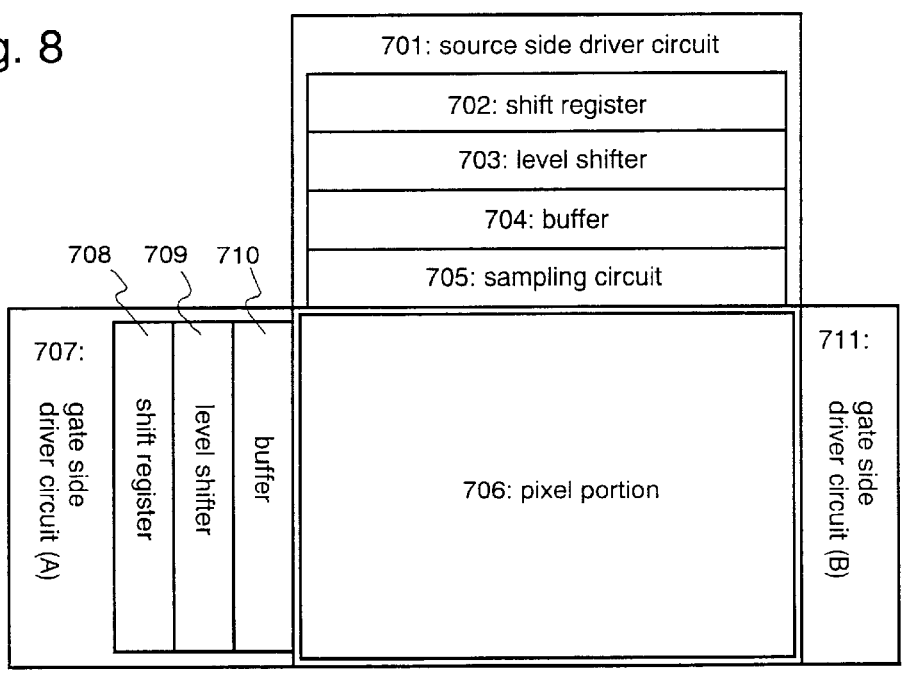
FIG. 8 is a view for illustrating the circuit configuration of the EL display device.

An example of circuit structure of the EL display device shown in FIG. 7 is shown in FIG. 8. The EL display device of this embodiment includes a source side driver circuit 701, a gate side driver circuit (A) 707, a gate side driver circuit (B) 711, and a pixel portion 706. Note that in the present specification, the term driver circuit is a general term including the source side driver circuit and the gate side driver circuit.

The source side driver circuit 701 is provided with a shift register 702, a level shifter 703, a buffer 704, and a sampling circuit (sample and hold circuit) 705. The gate side driver circuit (A) 707 is provided with a shift register 708, a level shifter 709, and a buffer 710. The gate side driver circuit (B) 711 also has the same structure.

Here, the shift registers 702 and 708 have driving voltages of 5 to 16 V (typically 10 V) respectively, and the structure indicated by 205 in FIG. 6C is suitable for an n-channel type TFT used in a CMOS circuit forming the circuit.

Besides, for each of the level shifters 703 and 709 and the buffers 704 and 710, similarly to the shift register, the CMOS circuit including the n-channel type TFT 205 of FIG. 6C is suitable. Note that it is effective to make a gate wiring line a multi-gate structure such as a double gate structure or a triple gate structure in improving reliability of each circuit.

Besides, since the source region and the drain region are inverted and it is necessary to decrease an off current value, a CMOS circuit including the n-channel type TFT 208 of FIG. is suitable for the sampling circuit 705.

The pixel portion 706 is disposed with pixels having the structure shown in FIG. 2.

The foregoing structure can be easily realized by manufacturing TFTs in accordance with the manufacturing steps shown in FIGS. 4A to 6C. In this embodiment, although only the structure of the pixel portion and the driver circuit is shown, if the manufacturing steps of this embodiment are used, it is possible to form a logical circuit other than the driver circuit, such as a signal dividing circuit, a D/A converter circuit, an operational amplifier circuit, a γ-correction circuit, or the like on the same substrate, and further, it is considered that a memory portion, a microprocessor, or the like can be formed.

Figure 11A:
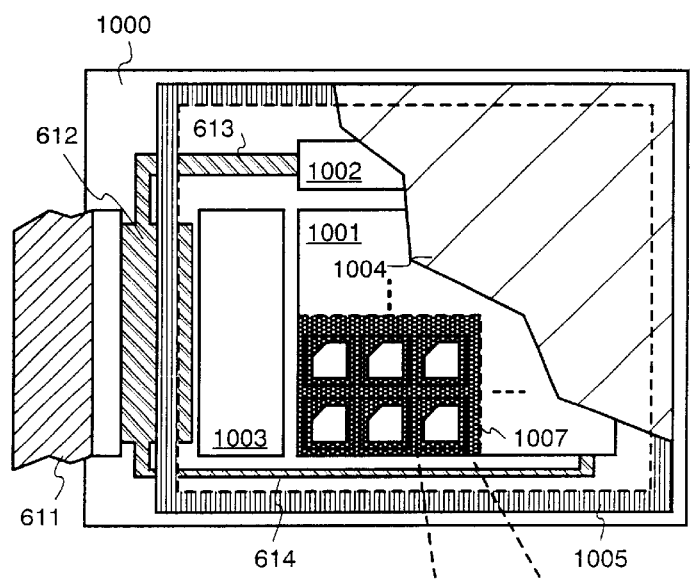
FIGS. 11A and 11B are a perspective view for illustrating an external appearance of the EL module and a view for illustrating a cross-sectional structure of the EL module, respectively.

Furthermore, the EL display device in accordance with the present embodiment will be described with reference to FIGS. 11A and 11B. The reference signs used in FIGS. 7 and 8 are referred if necessary.

A substrate 1000 (including a base film beneath TFTs) is an active matrix substrate. On the substrate, a pixel portion 1001, a source side driver circuit 1002, and a gate side driver circuit 1003 are formed. Various wirings from the respective driver circuits are extended through connection wirings 612 to 614 to reach an FPC 611 and be connected to an external device.

At this time, a counter substrate 1004 is provided to surround at least the pixel portion, and more preferably, the driver circuits and the pixel portion. The counter substrate 1004 is adhered to the active matrix substrate 1000 by means of an adhesive (sealing agent) 1005 to form a closed space 1006. Thus, the EL element is completely sealed in the closed space 1006 and shut out from the external air.

In the present embodiment, a photocurable epoxy resin is used as the adhesive 1005. Alternatively, other adhesives such as an acrylate type resin can also be used. A thermosetting resin can be also used if acceptable in view of heat-resistance of the EL element. Note that the material is required to prevent oxygen and water from passing therethrough as much as possible. The adhesive 1005 can be applied by a coating device such as a dispenser.

Furthermore, in the present embodiment, the closed space 1006 between the counter substrate 1004 and the active matrix substrate 1000 is filled with nitrogen gas. The black painted portion 1007 in FIG. 11A is showed as an alloy film, practically, provided to fill the gap between the pixel electrodes on the anode 1008. In this embodiment, as an alloy film 1007, the laminated structured alloy film which is composed of vapor evaporated titanium and aluminum.

Figure 11B:
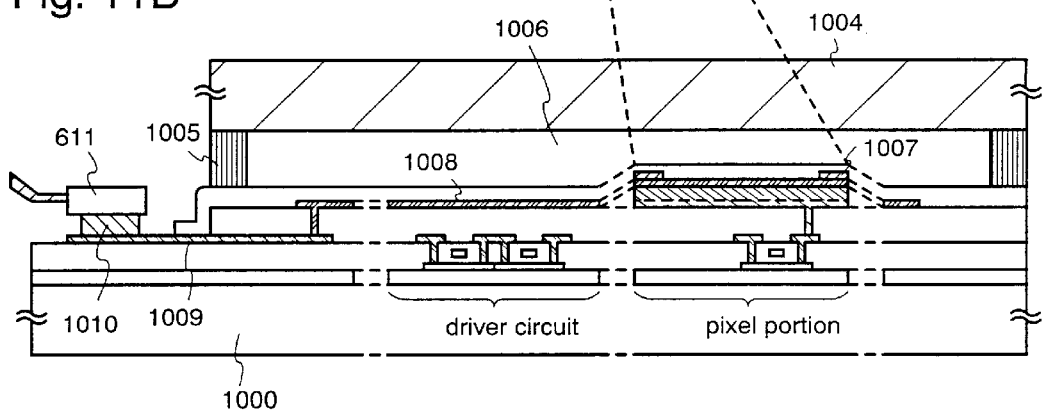

Furthermore, as shown in FIG. 11B, the pixel portion is provided with a plurality of pixels each including an individually separated EL element. All of these EL elements share an anode 1008 as a common electrode. The EL layer may be provided only in the pixel portion, but is not required to be disposed over the driver circuits. In order to selectively provide the EL layer, a vapor deposition method employing a shadow mask, a lift-off method, a dry etching method, or a laser scribing method can be used.

The anode 1008 is electrically connected to a connection wiring 1009. The connection wiring 1009 is a power supply line to be used for supplying a predetermined voltage to the anode 1008, and is connected to the FPC 611 through a conductive paste material 1010. Although only the connection wiring 1009 is described herein, the other connection wirings 612 to 614 are also electrically connected to the FPC 611 in the similar manner.

As described above, the structure as shown in FIG. 11 can display an image on its pixel portion by connecting the FPC 611 to a terminal of an external device. In the present specification, the EL display device is defined as a product in which an image display becomes possible when an FPC is attached thereto, in other words, a product obtained by attaching an active matrix substrate to a counter substrate including the one provided with an FPC attached thereto.

Embodiment 2

Although the description has been made on the case of the top gate type TFT in the embodiment 1, the present invention is not limited to the TFT structure, and may be applied to a bottom gate type TFT (typically, inverted stagger type TFT). Besides, the inverted stagger type TFT may be formed by any means.

Since the inverted stagger type TFT has such a structure that the number of steps can be easily made smaller than the top gate type TFT, it is very advantageous in reducing the manufacturing cost, which is the object of the present invention. Incidentally, the structure of this embodiment can be freely combined with any structure of the embodiment 1.

Embodiment 3

Figure 12:
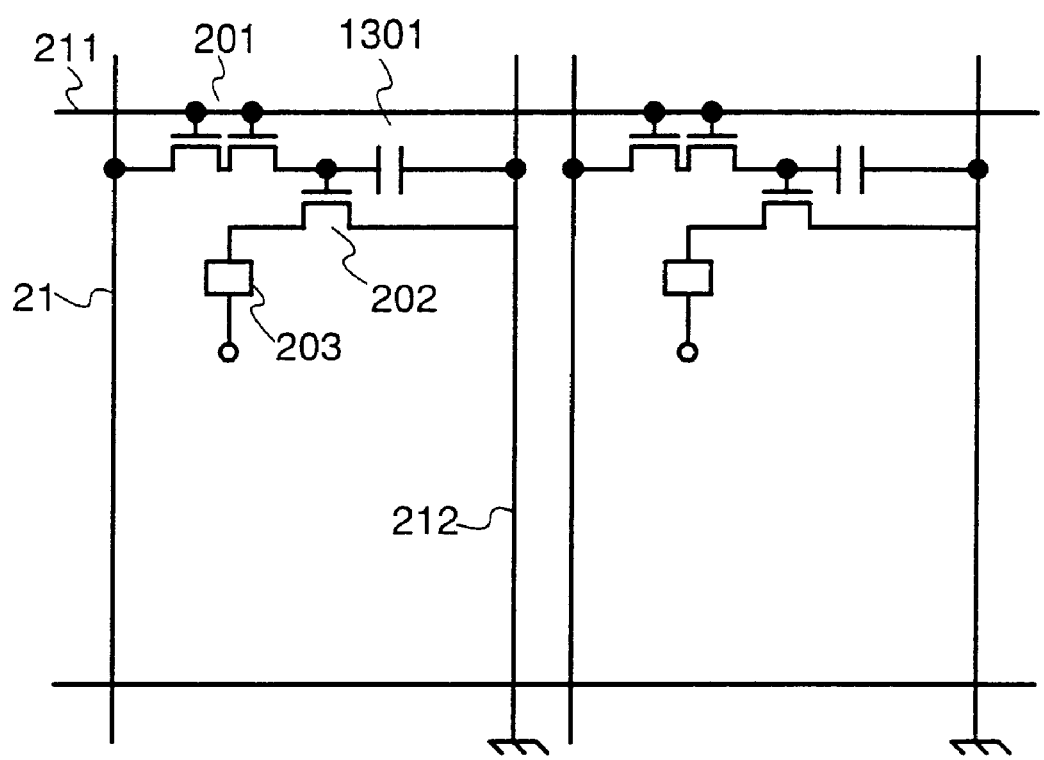
FIG. 12 is a view for illustrating the configuration of a pixel of the EL display device.

FIG. 3B shows that the amount of the off current value in the switching TFT in the pixel of the EL display device is reduced by using a multi-gate structure for the switching TFT, and the need for a storage capacitor is eliminated. However, it is also acceptable to make a structure of disposing a storage capacitor as is done conventionally. In this case, as shown in FIG. 12, a storage capacitor 1301 is formed in parallel to the gate of the current controlling TFT 202 with respect to the drain of the switching TFT 201.

Note that the constitution of embodiment 3 can be freely combined with any constitution of embodiments 1 and 2. Namely, a storage capacitor is merely formed within a pixel and it is not to limit the TFT structure, materials of EL layer, etc.

Embodiment 4

Laser crystallization is used as the means of forming the crystalline silicon film 302 in embodiment 1, and a case of using a different means of crystallization is explained in embodiment 4.

After forming an amorphous silicon film in embodiment 4, crystallization is performed using the technique described in Japanese Patent Application Laid-open No. Hei 7-130652. The technique described in the above patent application is one of obtaining a crystalline silicon film having good crystallinity by using an element such as nickel as a catalyst for promoting crystallization.

Further, after the crystallization process is completed, a process of removing the catalyst used in the crystallization may be performed. In this case, the catalyst may be gettered using the technique described in Japanese Patent Application Laid-open No. Hei 10-270363 or Japanese Patent Application Laid-open No. Hei 8-330602.

In addition, a TFT may be formed using the technique described in the specification of Japanese Patent Application No. Hei 11-076967 by the applicant of the present invention.

The manufacturing processes shown in embodiment 1 are one embodiment of the present invention, and provided that the structure of FIG. 2 or of FIG. 6C of embodiment 1 can be realized, then other manufacturing process may also be used without any problems, as above.

Note that it is possible to freely combine the constitution of embodiment 4 with the constitution of any of embodiments 1 to 3.

Embodiment 5

Figure 15:
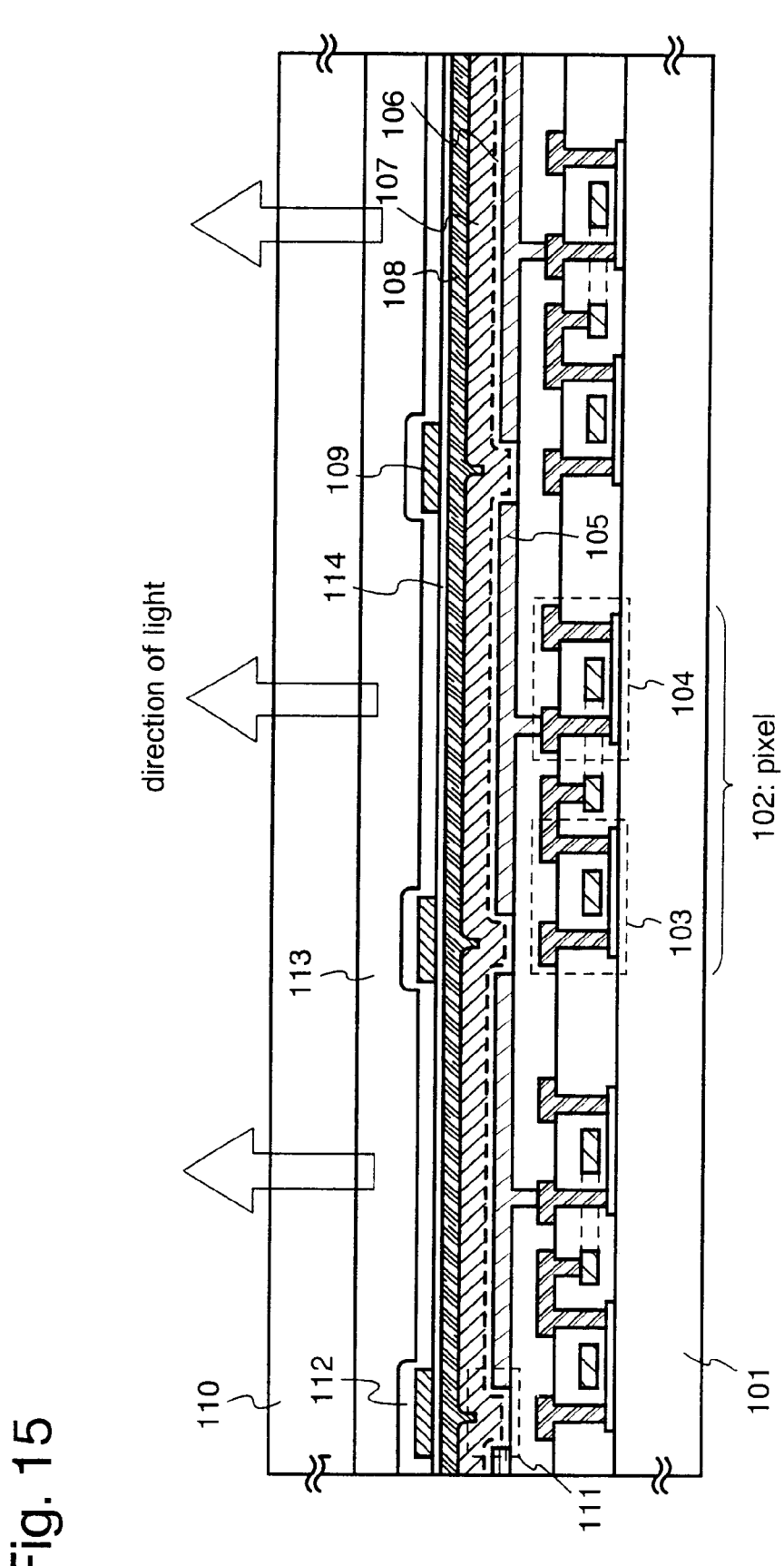
FIG. 15 is a view for illustrating a pixel section of the EL display device.

The first embodiment shows the structure in which the metal film 109 is provided on the anode 108 in the EL device so as to conceal the gaps 111 between the adjacent pixel electrodes. In the present embodiment, as shown in FIG. 15, a metal thin film 114 is formed on the anode 108 so as to be interposed between the anode 108 and the metal film 109.

A film thickness of the metal thin film 114 is set so as not to lose transparency, specifically in the range from 10 to 50 nm (preferably in the range from 20 to 30 nm). On the metal thin film 114, the metal film 109 is formed in a manner similar to Embodiment 1.

By providing the layered structure including the metal thin film 114 and the metal film 109 on the anode 108 in the EL device, an average film resistance of the anode can be decreased.

The structure in the present embodiment can be freely combined with any structure described in the previous embodiments.

Embodiment 6

The first embodiment shows the structure in which the metal film 109 is provided on the anode 108 in the EL device so as to conceal the gaps 111 between the adjacent pixel electrodes. In the present embodiment, as shown in FIG. 15, a metal thin film 114 made of chromium is formed on the anode 108 so as to be interposed between the anode 108 and the metal film 109 which will now be explained.

A film thickness of the metal thin film 114 is set so as not to lose transparency, specifically at about 50 nm (preferably at about 30 nm). On the metal thin film 114, the metal film 109 is formed in the manner similar to Embodiment 1.

By providing the layered structure including the metal thin film 114 and the metal film 109 on the anode 108 in the EL device, an average film resistance of the anode 108 can be decreased.

In the case where the anode 108 is made of a compound of indium oxide and tin oxide and the metal film 109 is made of aluminum in the present embodiment, the metal thin film 114 made of chromium can function to prevent electrical corrosion from occurring between the anode 108 and the metal film 109.

Furthermore, the metal thin film 114 made of chromium and the metal film 109 made of aluminum, as used in the present embodiment, can exhibit a sufficiently large selection ratio against a chlorine type etching gas. Thus, they are effective in the case where only the metal film 109 is to be selectively dry etched.

The structure in the present embodiment can be freely combined with any structure described in the previous embodiments.

Embodiment 7

In driving the EL display device of the present invention, analog driving can be performed using an analog signal as an image signal, and digital driving can be performed using a digital signal.

When analog driving is performed, the analog signal is sent to a source wiring of a switching TFT, and the analog signal, which contains gray scale information, becomes the gate voltage of a current controlling TFT. The current flowing in an EL element is then controlled by the current controlling TFT, emitting intensity of the EL element is controlled, and gray scale display is performed.

On the other hand, in the case of digital driving, gray scale display referred to as "time-division driving" is performed unlike the gray scale display on an analog basis. Specifically, the emitting time is adjusted to provide visual appearance that seems like changes in color gradation. The EL element has an extremely fast response speed in comparison to a liquid crystal element, and therefore it is possible to have high speed driving. Therefore, the EL element is one, which is suitable for time division driving, in which one frame is partitioned into a plural number of sub-frames and then gray scale display is performed.

The present invention is a technique related to the element structure, and therefore any method of driving it may thus be used.

Note that the structure of this embodiment can be freely combined with any structure of the embodiments 1 to 6.

Embodiment 8

The EL display device uses light emitted from itself to display an image, and thus, does not require any back light. A reflection type liquid crystal display device requires a back light in a dark place where sufficient light is not available, although it has a feature in that an image can be displayed with outdoor light. On the other hand, the EL display device is not suffered from such a disadvantage in a dark place, since it is of the self-emission type.

However, when an electronic device including the EL display device as its display portion is actually used outdoors, it may be of course used both in a light place and in a dark place. In such a situation, an image can be sufficiently recognized in a dark place even when the luminance is not so high, while an image may not be recognized in a light place if the luminance is not sufficiently high.

An amount of light emitted from the EL layer varies depending on an amount of current to flow. Thus, a larger amount of current to flow requires the higher luminance, resulting in an increased power consumption. However, when the luminance of emitted light is set at such a high level, too brighter image than necessary with too large power consumption will be displayed in a dark place.

In order to overcome the above-mentioned disadvantage, the EL display device in accordance with the present invention preferably has a function to detect the lightness in the surrounding atmosphere by means of a sensor, and adjust the luminance of the light emitted from the EL layer in accordance with the sensed lightness. More specifically, the luminance of the emitted light is set at a high level in a light place, while at a low level in a dark place, so that an increase in power consumption is avoided. Thus, the EL display device in accordance with the present invention can realize reduction in power consumption.

As a sensor to be used for detecting lightness in the surrounding atmosphere, a CMOS sensor, a CCD or the like can be used. A CMOS sensor can be formed with any known technique on the identical substrate with driver circuits and a pixel portion of the EL display device. A semiconductor chip on which a CCD is formed can be attached onto the EL display device. Alternatively, a CCD or a CMOS sensor may be provided as a portion of an electronic device including the EL display device as its display portion.

A circuit for adjusting a current to flow into the EL layer based on a signal obtained by the sensor for detecting the lightness in the surrounding atmosphere is provided. Thus, the luminance of the light emitted from the EL layer can be adjusted in accordance with the lightness in the surrounding atmosphere.

The structure in the present embodiment is applicable in combination with any structure in Embodiments 1 to 7.

Embodiment 9

The EL display device fabricated in accordance with the present invention is of the self-emission type, and thus exhibits more excellent recognizability of the displayed image in a light place as compared to the liquid crystal display device. Furthermore, the EL display device has a wider viewing angle. Accordingly, the EL display device can be applied to a display portion in various electronic devices. For example, in order to view a TV program or the like on a large-sized screen, the EL display device in accordance with the present invention can be used as a display portion of an EL display (i.e., a display in which an EL display device is installed into a frame) having a diagonal size of 30 inches or larger (typically 40 inches or larger).

The EL display includes all kinds of displays to be used for displaying information, such as a display for a personal computer, a display for receiving a TV broadcasting program, a display for advertisement display. Moreover, the EL display device in accordance with the present invention can be used as a display portion of other various electric devices.

Such electronic devices include a video camera, a digital camera, a goggle-type display (head mount display), a car navigation system, a car audio equipment, note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a compact disc (CD), a laser disc (LD), a digital video disc (DVD), and includes a display for displaying the reproduced image), or the like. In particular, in the case of the portable information terminal, use of the EL display device is preferable, since the portable information terminal that is likely to be viewed from a tilted direction is often required to have a wide viewing angle. FIG. 13 shows various specific examples of such electronic devices.

Figure 13A:
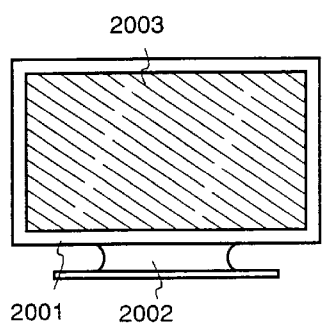
FIGS. 13A through 13F are views for respectively illustrating specific examples of electrical equipment.

FIG. 13A illustrates an EL display which includes a frame 2001, a support table 2002, a display portion 2003, or the like. The present invention is applicable to the display portion 2003. The EL display is of the self-emission type and therefore requires no back light. Thus, the display portion thereof can have a thickness thinner than that of the liquid crystal display device.

Figure 13B:
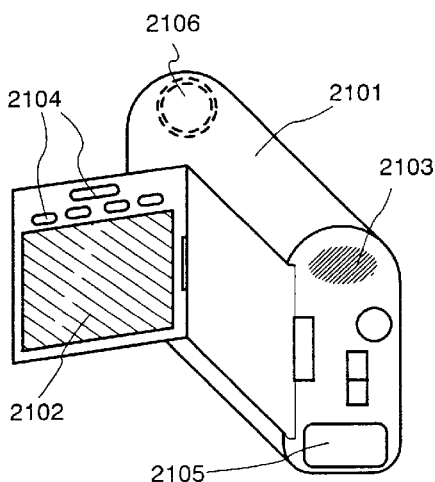

FIG. 13B illustrates a video camera which includes a main body 2101, a display portion 2102, an audio input portion 2103, operation switches 2104, a battery 2105, an image receiving portion 2106, or the like. The EL display device in accordance with the present invention can be used as the display portion 2102.

Figure 13C:
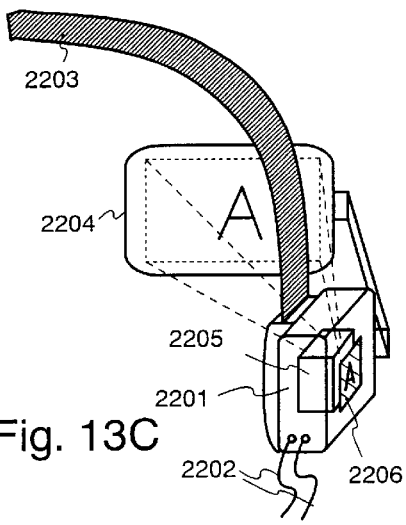

FIG. 13C illustrates a portion (the right-half piece) of an EL display of head mount type, which includes a main body 2201, signal cables 2202, a head mount band 2203, a projection portion 2204, an optical system 2205, a display portion 2206, or the like. The present invention is applicable to the display portion 2206.

Figure 13D:
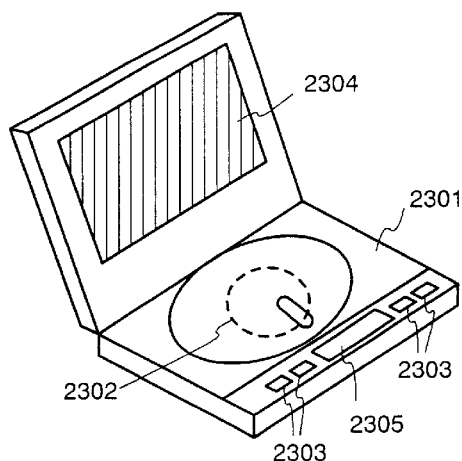

FIG. 13D illustrates an image reproduction apparatus including a recording medium (more specifically, a DVD reproduction apparatus), which includes a main body 2301, a recording medium (a CD, an LD, a DVD or the like) 2302, operation switches 2303, a display portion (a) 2304, another display portion (b) 2305, or the like. The display portion (a) is used mainly for displaying image information, while the display portion (b) is used mainly for displaying character information. The EL display device in accordance with the present invention can be used as these display portions (a) and (b). The image reproduction apparatus including a recording medium further includes a CD reproduction apparatus, a game machine or the like.

Figure 13E:
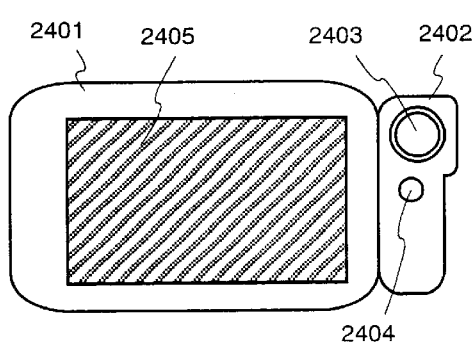

FIG. 13E illustrates a portable (mobile) computer which includes a main body 2401, a camera portion 2402, an image receiving portion 2403, operation switches 2404, a display portion 2405, or the like. The EL display device in accordance with the present invention can be used as the display portion 2405.

Figure 13F:
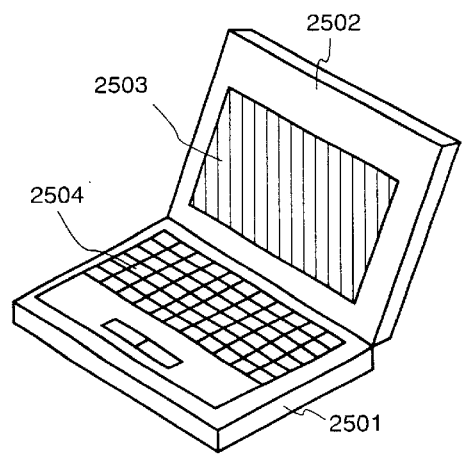

FIG. 13F illustrates a personal computer which includes a main body 2501, a frame 2502, a display portion 2503, a key board 2504, or the like. The EL display device in accordance with the present invention can be used as the display portion 2503.

When the brighter luminance of light emitted from the EL material becomes available in the future, the EL display device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The EL display device is suitable for displaying moving pictures since the EL material can exhibit high response speed. However, if the contour between the pixels becomes unclear, the moving pictures as a whole cannot be clearly displayed. Since the EL display device in accordance with the present invention can make the contour between the pixels clear, it is significantly advantageous to apply the EL display device of the present invention to a display portion of the electronic devices.

A portion of the EL display device that is emitting light consumes power, so it is desirable to display information in such a manner that the light emitting portion therein becomes as small as possible. Accordingly, when the EL display device is applied to a display portion which mainly displays character information, e.g., a display portion of a portable information terminal, and more particular, a portable telephone or a car audio equipment, it is desirable to drive the EL display device so that the character information is formed by a light-emitting portion while a non-emission portion corresponds to the background.

Figure 14A:
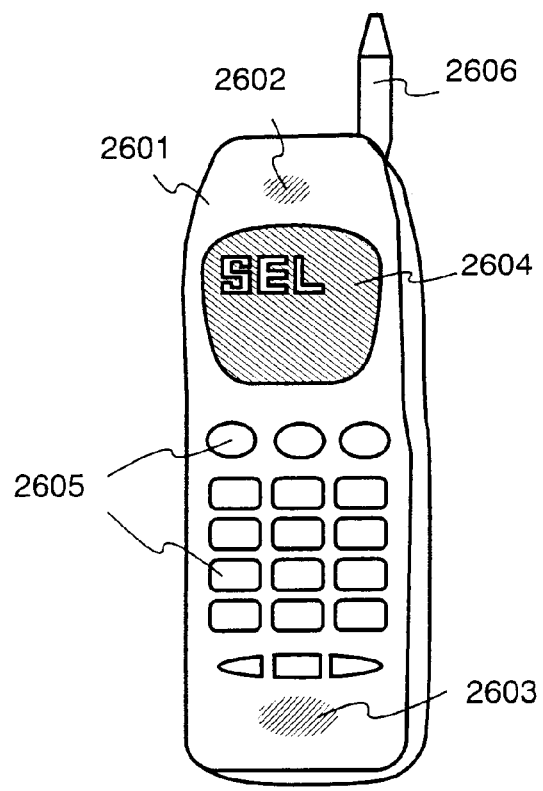
FIGS. 14A and 14B are views for respectively illustrating specific examples of electrical equipment.

With now reference to FIG. 14A, a portable telephone is illustrated, which includes a main body 2601, an audio output portion 2602, an audio input portion 2603, a display portion 2604, operation switches 2605, and an antenna 2606. The EL display device in accordance with the present invention can be used as the display portion 2604. The display portion 2604 can reduce power consumption of the portable telephone by displaying white-colored characters on a black-colored background.

Figure 14B:
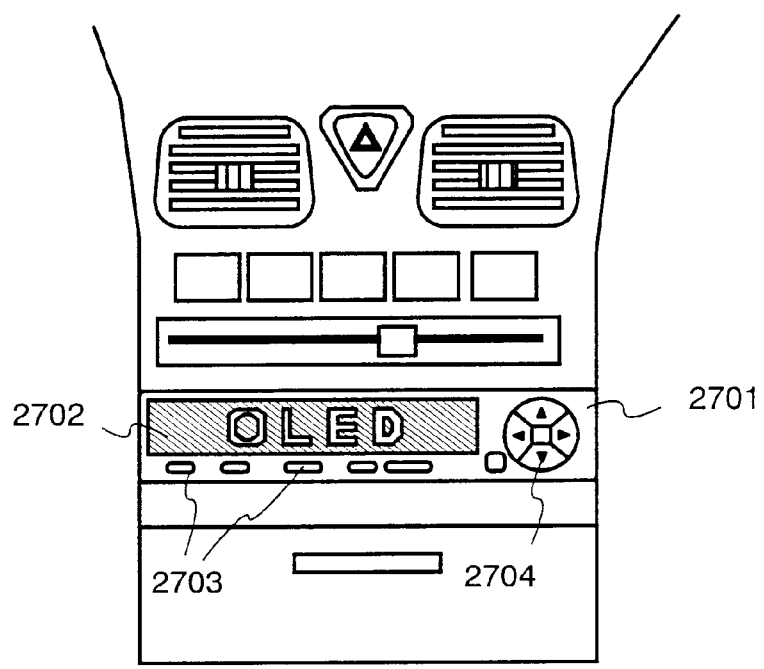

FIG. 14B illustrates a car audio equipment which includes a main body 2701, a display portion 2702, and operation switches 2703 and 2704. The EL display device in accordance with the present invention can be used as the display portion 2702. Although the car audio equipment of the mount type is shown in the present embodiment, the present invention is also applicable to a car audio of the set type. Note that the display portion 2704 can reduce power consumption by displaying white-colored characters on a black-colored background.

As set forth above, the present invention can be applied variously to a wide range of electronic devices in all fields. The electronic device in the present embodiment can be obtained by utilizing an EL display device having the configuration in which the structures in Embodiments 1 through 8 are freely combined.

Embodiment 10

In the present invention, among the light emitted from the EL layer, portions thereof emitted toward the cathode side are reflected from the cathode and then emitted through the anode side.

In this case, with respect to the regions where the EL layer is emitting light, a light having a wavelength determined based on the constituent material of the light emitting layer can be visible. However, in the other regions that do not emit light, a rear surface side of the cathode (i.e., the surface closer to the light emitting layer) can be seen through the anode and the EL layer. Thus, a disadvantage arises in which the rear surface of the cathode functions as a mirror to reflect a viewer's face. In the present embodiment, an example for overcoming such a disadvantage will be described.

As the simplest method for overcoming the disadvantage, a circularly polarizing film can be adhered to the EL display device. However, this undesirably results in an increased cost since the circularly polarizing film is expensive. As an alternative method, it is possible to provide raised portions on the reflecting surface (i.e., on the surface closer to the light emitting layer) of the cathode so as to scatter the light reflected from the reflecting surface of the cathode.

More specifically, the visible light (external light) incident from the anode side is allowed to be randomly reflected from the reflecting surface of the cathode, thereby preventing the reflecting surface of the cathode from being visible to a viewer.

The raised portions to be provided on the reflecting surface of the cathode may be formed by providing concave recesses or convex projections. Alternatively, a corrugated surface may be provided in which concave and convex portions are repeatedly formed. The raised portions as mentioned above may be formed by a photo-lithographic formation technique, a holographic formation technique (for example, the concave and convex reflection structure described in Sharp Technical Report, Vol. 74, pp. 16–19, Issue of August, 1999) or the like. Alternatively, the raised portions may be formed by a surface treatment method such as a plasma process, an etching process, or the like. Furthermore, the raised portions may be naturally formed on the surface of the cathode depending on the deposition conditions of the cathode (or the deposition condition of the electrode underlying the cathode).

In other words, although the raised portions may be provided either regularly or irregularly, they have to be provided so as to allow random reflection to occur in an averaged manner within the in-plane of the respective pixels. Alternatively, the raised portions may be formed on the other thin film contacting the cathode. In particular, the techniques described in Japanese Patent Application Laid-Open Nos. Hei. 9-69642 and 10-144927 can be employed as the measure for forming the raised portions on an aluminum film. More specifically, an aluminum film may be formed in accordance with the techniques described in the above-mentioned publications and a cathode is then deposited on the thus formed aluminum film, thereby resulting in the cathode having the raised portions provided thereon.

By employing the technique as mentioned above, a viewer's face is prevented from being reflected from and seen on the rear surface of the cathode. The structure in the present embodiment can be freely combined with any structure described in the previous embodiments.

Thus, as set forth above, by implementing the present invention, an average film resistance of the anode can be reduced by the metal film provided on the anode. Furthermore, the above-mentioned metal film is a light-shielding film which is disposed so as to conceal the gaps between the pixels, thereby resulting in clearer contours between the pixel electrodes in the pixel section. Thus, an EL display device capable of displaying an image with high definition can be obtained. Moreover, by utilizing the EL display device in accordance with the present invention as a display section, electrical equipment with the high reliability and high visibility can be provided.

What is claimed is:

1. An EL display device comprising:
   an active-matrix substrate over which pixels are arranged, each of said pixels having a pixel electrode electrically connected to a thin-film transistor; and
   an EL element comprising said pixel electrode as a cathode, an EL layer, and an anode,
   wherein a metal film is provided in contact with said anode so as to conceal edges of said pixels and gaps between said pixels.

2. An EL display device according to claim 1, wherein a film resistance of said metal film is lower than a film resistance of said anode.

3. An EL display device according to claim 1, wherein said metal film functions as a light-shielding film.

4. An EL display device according to claim 1, wherein said metal film has a layered structure.

5. An EL display device according to claim 1, wherein raised portions are provided on a surface of said cathode of said EL element.

6. An EL display device according to claim 1, wherein an element of said metal film is one selected from a group consisting of Ti, Al, Ta, W, Cr, Cu, and Ag.

7. An EL display device according to claim 1, wherein said anode comprises indium tin oxide.

8. An EL display device according to claim 1, wherein said cathode comprises aluminum.

9. An EL display device according to claim 1, wherein said EL display device is incorporated in one selected from a group consisting of a video camera, a head-mount display, an image reproduction apparatus, a portable computer, a personal computer, a car navigation system, a mobile telephone, and a car audio equipment.

10. An EL display device comprising:
    an active-matrix substrate over which pixels are arranged, each of said pixels having a pixel electrode electrically connected to a thin-film transistor; and
    an EL element comprising said pixel electrode as a cathode, an EL layer, and an anode,
    wherein a metal film is provided between said anode and a counter substrate so as to conceal edges of said pixels and gaps between said pixels.

11. An EL display device according to claim 10, wherein a film resistance of said metal film is lower than a film resistance of said anode.

12. An EL display device according to claim 10, wherein said metal film functions as a light-shielding film.

13. An EL display device according to claim 10, wherein said metal film has a layered structure.

14. An EL display device according to claim 10, wherein raised portions are provided on a surface of said cathode of said EL element.

15. An EL display device according to claim 10, wherein an element of said metal film is one selected from a group consisting of Ti, Al, Ta, W, Cr, Cu, and Ag.

16. An EL display device according to claim 10, wherein said anode comprises indium tin oxide.

17. An EL display device according to claim 10, wherein said cathode comprises aluminum.

18. An EL display device according to claim 10, wherein said EL display device is incorporated in one selected from the group consisting of a video camera, a head-mount display, an image reproduction apparatus, a portable computer, a personal computer, a car navigation system, a mobile telephone, and a car audio equipment.

19. An EL display device comprising:
    an active-matrix substrate over which pixels are arranged, each of said pixels having a pixel electrode electrically connected to a thin-film transistor; and
    an EL element comprising said pixel electrode as a cathode, an EL layer, and an anode,
    wherein a metal film is provided in contact with a portion of said anode so as to conceal gaps between said pixel electrodes.

20. An EL display device according to claim 19, wherein a film resistance of said metal film is lower than a film resistance of said anode.

21. An EL display device according to claim 19, wherein said metal film functions as a light-shielding film.

22. An EL display device according to claim 19, wherein said metal film has a layered structure.

23. An EL display device according to claim 19, wherein raised portions are provided on a surface of said cathode of said EL element.

24. An EL display device according to claim 19, wherein an element of said metal film is one selected from a group consisting of Ti, Al, Ta, W, Cr, Cu, and Ag.

25. An EL display device according to claim 19, wherein said anode comprises indium tin oxide.

26. An EL display device according to claim 19, wherein said cathode comprises aluminum.

27. An EL display device according to claim 19, wherein said EL display device is incorporated in one selected from a group consisting of a video camera, a head-mount display, an image reproduction apparatus, a portable computer, a personal computer, a car navigation system, a mobile telephone, and a car audio equipment.

28. An EL display device comprising:
    an active-matrix substrate over which pixels are arranged, each of said pixels having a pixel electrode electrically connected to a thin-film transistor; and
    an EL element comprising said pixel electrode as a cathode, an EL layer, and an anode,
    wherein a metal film is provided between a portion of said anode and a counter substrate so as to conceal gaps between said pixel electrodes.

29. An EL display device according to claim 28, wherein a film resistance of said metal film is lower than a film resistance of said anode.

30. An EL display device according to claim 28, wherein said metal film functions as a light-shielding film.

31. An EL display device according to claim 28, wherein said metal film has a layered structure.

32. An EL display device according to claim 28, wherein raised portions are provided on a surface of said cathode of said EL element.

33. An EL display device according to claim 28, wherein an element of said metal film is one selected from a group consisting of Ti, Al, Ta, W, Cr, Cu, and Ag.

34. An EL display device according to claim 28, wherein said anode comprises indium tin oxide.

35. An EL display device according to claim 28, wherein said cathode comprises aluminum.

36. An EL display device according to claim 28, wherein said EL display device is incorporated in one selected from a group consisting of a video camera, a head-mount display, an image reproduction apparatus, a portable computer, a personal computer, a car navigation system, a mobile telephone, and a car audio equipment.

37. An EL display device comprising:

a thin film transistor formed over a substrate;

an EL element comprising a cathode and an anode with an EL layer interposed therebetween, said EL element electrically connected to said thin film transistor; and a metal film in contact with said anode, said metal film provided so as to be overlapped with a portion of said cathode.

38. An EL display device according to claim 37, wherein a film resistance of said metal film is lower than a film resistance of said anode.

39. An EL display device according to claim 37, wherein said metal film functions as a light-shielding film.

40. An EL display device according to claim 37, wherein said metal film has a layered structure.

41. An EL display device according to claim 37, wherein raised portions are provided on a surface of said cathode of said EL element.

42. An EL display device according to claim 37, wherein an element of said metal film is one selected from a group consisting of Ti, Al, Ta, W, Cr, Cu, and Ag.

43. An EL display device according to claim 37, wherein said anode comprises indium tin oxide.

44. An EL display device according to claim 37, wherein said cathode comprises aluminum.

45. An EL display device according to claim 37, wherein said EL display device is incorporated in one selected from a group consisting of a video camera, a head-mount display, an image reproduction apparatus, a portable computer, a personal computer, a car navigation system, a mobile telephone, and a car audio equipment.

46. An EL display device comprising:

a thin film transistor formed over a substrate;

an EL element comprising a cathode and an anode with an EL layer interposed therebetween, said EL element electrically connected to said thin film transistor; and a metal film in contact with a portion of said anode, said metal film provided so as to be overlapped with a portion of said cathode.

47. An EL display device according to claim 46, wherein a film resistance of said metal film is lower than a film resistance of said anode.

48. An EL display device according to claim 46, wherein said metal film functions as a light-shielding film.

49. An EL display device according to claim 46, wherein said metal film has a layered structure.

50. An EL display device according to claim 46, wherein raised portions are provided on a surface of said cathode of said EL element.

51. An EL display device according to claim 46, wherein an element of said metal film is one selected from a group consisting of Ti, Al, Ta, W, Cr, Cu, and Ag.

52. An EL display device according to claim 46, wherein said anode comprises indium tin oxide.

53. An EL display device according to claim 46, wherein said cathode comprises aluminum.

54. An EL display device according to claim 46, wherein said EL display device is incorporated in one selected from a group consisting of a video camera, a head-mount display, an image reproduction apparatus, a portable computer, a personal computer, a car navigation system, a mobile telephone, and a car audio equipment.

* * * * *